US011139387B2

(12) United States Patent
Lee

(10) Patent No.: US 11,139,387 B2
(45) Date of Patent: Oct. 5, 2021

(54) SEMICONDUCTOR DEVICE AND METHOD OF FORMING THE SAME

(71) Applicant: SAMSUNG ELECTRONICS CO., LTD., Suwon-si (KR)

(72) Inventor: Jun Noh Lee, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 46 days.

(21) Appl. No.: 16/549,854

(22) Filed: Aug. 23, 2019

(65) Prior Publication Data
US 2020/0127126 A1 Apr. 23, 2020

(30) Foreign Application Priority Data
Oct. 19, 2018 (KR) .................. 10-2018-0125403

(51) Int. Cl.
H01L 21/311 (2006.01)
H01L 29/66 (2006.01)
H01L 21/3213 (2006.01)
H01L 27/11556 (2017.01)
H01L 27/11582 (2017.01)

(52) U.S. Cl.
CPC .. H01L 29/66833 (2013.01); H01L 21/31105 (2013.01); H01L 21/32139 (2013.01); H01L 29/66666 (2013.01); H01L 27/11556 (2013.01); H01L 27/11582 (2013.01)

(58) Field of Classification Search
None
See application file for complete search history.

(56) References Cited

U.S. PATENT DOCUMENTS

| 8,373,222 | B2 | 2/2013 | Sekine et al. |
| 8,415,742 | B2 | 4/2013 | Kim et al. |
| 8,748,966 | B2 | 6/2014 | Whang et al. |
| 8,754,391 | B2 | 6/2014 | Seong et al. |
| 8,765,551 | B2 | 7/2014 | Yang et al. |
| 9,159,570 | B2 | 10/2015 | Kim et al. |
| 9,449,981 | B2 | 9/2016 | Pachamuthu et al. |
| 9,466,609 | B2 | 10/2016 | Kim et al. |
| 9,484,357 | B2 | 11/2016 | Makala et al. |
| 9,484,358 | B2 | 11/2016 | Alsmeier |
| 9,806,090 | B2 | 10/2017 | Sharangpani et al. |
| 10,411,089 | B2 * | 9/2019 | Kim .................. H01L 29/0649 |
| 2014/0264527 | A1 | 9/2014 | Koval et al. |
| 2014/0291747 | A1 | 10/2014 | Simsek-Ege et al. |

(Continued)

Primary Examiner — Jack S Chen
(74) Attorney, Agent, or Firm — Volentine, Whitt & Francos, PLLC

(57) ABSTRACT

A method of forming a semiconductor device includes forming, on a lower structure, a mold structure having interlayer insulating layers and gate layers alternately and repeatedly stacked. Each of the gate layers is formed of a first layer, a second layer, and a third layer sequentially stacked. The first and third layers include a first material, and the second layer includes a second material having an etch selectivity different from an etch selectivity of the first material. A hole formed to pass through the mold structure exposes side surfaces of the interlayer insulating layers and side surfaces of the gate layers. Gate layers exposed by the hole are etched, with an etching speed of the second material differing from an etching speed of the first material, to create recessed regions.

20 Claims, 25 Drawing Sheets

(56) References Cited

U.S. PATENT DOCUMENTS

| | | |
|---|---|---|
| 2015/0311087 A1 | 10/2015 | Simsek-Ege et al. |
| 2016/0190313 A1 | 6/2016 | Koval et al. |
| 2016/0307914 A1 | 10/2016 | Sun et al. |
| 2018/0047743 A1 | 2/2018 | Kwon |
| 2019/0139983 A1* | 5/2019 | Lee .................. H01L 27/11524 |
| 2020/0127126 A1* | 4/2020 | Lee .................. H01L 21/32139 |

* cited by examiner

'C'

'C'

SEMICONDUCTOR DEVICE AND METHOD OF FORMING THE SAME

CROSS-REFERENCE TO RELATED APPLICATION(S)

This application claims benefit of priority to Korean Patent Application No. 10-2018-0125403 filed on Oct. 19, 2018 in the Korean Intellectual Property Office, the disclosure of which is incorporated herein by reference in its entirety.

BACKGROUND

1. Field

The present disclosure relates to a semiconductor device, and more particularly, to a semiconductor device and a method of forming the same.

2. Description of Related Art

In order to increase the price competitiveness of products, there is growing demand for improvements in a degree of integration of semiconductor devices. To improve a degree of integration of a semiconductor device, a semiconductor device including gates stacked while being spaced apart from each other in a direction perpendicular to an upper surface of a semiconductor substrate has been developed. As the stacking number of gates is increased, interference between data storage regions opposing the gates may also be increased.

SUMMARY

An aspect of the present disclosure is to provide a semiconductor device capable of capable of improving a degree of integration.

An aspect of the present disclosure is to provide a method of forming a semiconductor device capable of improving a degree of integration.

According to an aspect of the present disclosure, a method of forming a semiconductor device is provided. The method of forming a semiconductor device includes: forming a mold structure on a lower structure, the mold structure including interlayer insulating layers and gate layers alternately and repeatedly stacked, each of the gate layers being formed of a first layer, a second layer, and a third layer, sequentially stacked, the first layer and the third layer including a first material, the second layer including a second material having an etch selectivity different from an etch selectivity of the first material; exposing side surfaces of the interlayer insulating layers and side surfaces of the gate layers by forming a hole passing through the mold structure; forming the hole as an extended hole, the forming the hole as the extended hole including forming recessed regions by partially etching the gate layers, exposed by the hole, by performing an etching process in which an etching speed of the second material is different from an etching speed of the first material; and forming a memory vertical structure in the extended hole.

According to an aspect of the present disclosure, a method of forming a semiconductor device is provided. The method of forming a semiconductor device includes: forming a mold structure including interlayer insulating layers and gate layers alternately and repeatedly stacked on a lower structure, each of the gate layers being formed of a first layer, a second layer, and a third layer, sequentially stacked, the first layer and the third layer being formed of the same first material, the second layer being formed of a second material having an etch selectivity different from an etch selectivity of the first material; forming a hole passing through the mold structure; forming recessed regions by partially etching the gate layers exposed by the hole using a first etching process, the hole being formed as an extended hole including the recessed regions; forming a memory vertical structure in the extended hole; forming a separation trench passing through the mold structure; forming empty spaces exposing a side surface of the memory vertical structure by removing the gate layers exposed by the separation trench using a second etching process in which an etching speed for etching the gate layer is relatively fast, as compared with the first etching process; and forming gate patterns in the empty spaces.

According to an aspect of the present disclosure, a method of forming a semiconductor device is provided. The method of forming a semiconductor device includes: forming a mold structure, the mold structure including interlayer insulating layers and a gate layer between the interlayer insulating layers, the gate layer including portions having an etch selectivity different from each other; forming a hole exposing the interlayer insulating layers and the gate layer while passing through the mold structure; forming a recessed region by partially etching the gate layer exposed by the hole, the hole being formed as an extended hole; and forming a memory vertical structure in the extended hole.

According to an aspect of the present disclosure, a semiconductor device is provided. The semiconductor device includes a stacked structure on a lower structure and a memory vertical structure extended in a vertical direction perpendicular to an upper surface of the lower structure on the lower structure. The stacked structure includes interlayer insulating layers and a cell gate pattern between the interlayer insulating layers. The memory vertical structure includes a first portion opposing the cell gate pattern and second portions having a width greater than a width of the first portion while opposing the interlayer insulating layers. The memory vertical structure includes a first dielectric layer and a second dielectric layer, in contact with each other in the second portions, extended toward the first portion, and spaced apart from each other in the first portion. The memory vertical structure further includes a data storage pattern disposed between the first dielectric layer and the second dielectric layer in the first portion, and the cell gate pattern has a side surface including a curved shape.

According to an aspect of the present disclosure, a semiconductor device is provided. The semiconductor device includes a stacked structure disposed on a lower structure and including interlayer insulating layers and a cell gate pattern between the interlayer insulating layers. A memory vertical structure passes through the stacked structure. The memory vertical structure includes a first portion located on a level the same as a level of the cell gate pattern and second portions located on a level the same as a level of the interlayer insulating layers and having a width smaller than a width of the first portion. The memory vertical structure includes a first dielectric layer, a second dielectric layer, and a channel semiconductor layer, sequentially disposed on a side surface of the cell gate pattern, and extended toward side surfaces of the interlayer insulating layers. The first dielectric layer and the second dielectric layer are spaced apart from each other on a side surface of the cell gate pattern while being in contact with each other on side surfaces of the interlayer insulating layers. The memory vertical structure further includes a data storage pattern disposed between the first dielectric layer and the second dielectric layer while being disposed in the first portion of the memory vertical structure. The cell gate pattern includes a protruding portion protruding in a direction toward the memory vertical structure in the cell gate pattern.

According to an aspect of the present disclosure, a semiconductor device is provided. The semiconductor device includes a stacked structure disposed on a lower structure and including interlayer insulating layers and cell gate patterns, alternately and repeatedly stacked. A memory vertical structure is disposed on the lower structure and extended in a vertical direction perpendicular to an upper surface of the lower structure. The memory vertical structure includes first portions opposing side surfaces of the cell gate patterns and second portions opposing side surfaces of the interlayer insulating layers. The memory vertical structure includes a first dielectric layer, a second dielectric layer, and a channel semiconductor layer, sequentially stacked on side surfaces of the cell gate patterns in the first portions, and extended toward the second portions. The memory vertical structure further includes data storage patterns disposed between the first dielectric layer and the second dielectric layer in the first portions. Each of the cell gate patterns includes a first material layer and a second material layer. The first material layer is extended between the second material layer and the interlayer insulating layers while being interposed between the second material layer and the memory vertical structure. The first material layer has a thickness thinner than a thickness of the first dielectric layer. Each of the data storage patterns includes an overlapping portion overlapping the interlayer insulating layers in the vertical direction and a non-overlapping portion not overlapping the interlayer insulating layers in the vertical direction. A length of the overlapping portion in a horizontal direction is greater than a length of the non-overlapping portion in a horizontal direction. The horizontal direction is a direction parallel to an upper surface of the lower structure.

BRIEF DESCRIPTION OF DRAWINGS

The above and other aspects, features and advantages of the present disclosure will be more clearly understood from the following detailed description, taken in conjunction with the accompanying drawings, in which.

DETAILED DESCRIPTION

Figure 1:
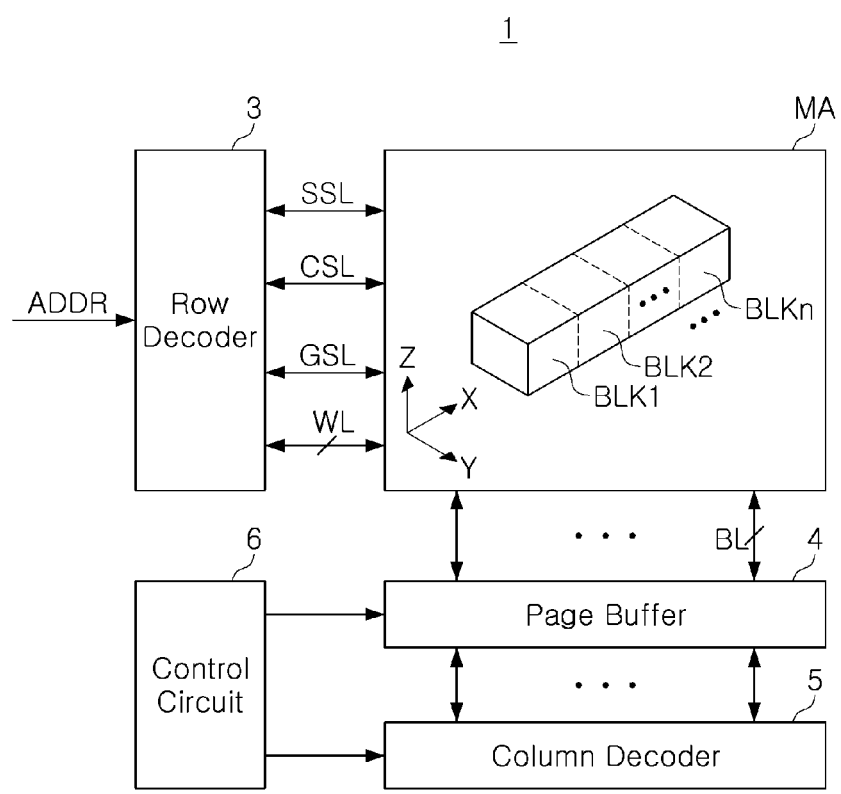
FIG. 1 is a schematic block diagram illustrating a semiconductor device according to an example embodiment.

An example of a semiconductor device according to an example embodiment will be described with reference with FIG. 1. FIG. 1 is a schematic block diagram illustrating a semiconductor device according to an example embodiment.

Referring to FIG. 1, a semiconductor device 1 according to an example embodiment may include a memory array region MA, a row decoder 3, a page buffer 4, a column decoder 5, and a control circuit 6. The memory array region MA may include a plurality of memory blocks BLK1, BLK2 . . . , BLKn.

Each of the memory blocks BLK1, BLK2, . . . BLKn in the memory array region MA may include memory cells arranged in a plurality of rows and a plurality of columns. The memory cells, included in the memory array region MA, may be electrically connected to the row decoder 3 through word lines WL, at least one common source line CSL, string select lines SSL, and at least one ground select line GSL, and may be electrically connected to the page buffer 4 and the column decoder 5 through bit lines BL.

In an example embodiment, among the memory cells, memory cells arranged in the same row may be connected to a single word line WL, and memory cells arranged in the same column may be connected to a single bit line BL.

The row decoder 3 may be commonly connected to the memory blocks BLK1, BLK2, . . . BLKn, and may provide a driving signal to word lines WL of the memory blocks BLK1, BLK2, . . . BLKn, selected according to a block select signal. For example, the row decoder 3 may receive address information ADDR from an external source, and may decode the address information ADDR, having been received, to determine a voltage provided to at least a portion of the word lines WL, the common source line CSL, the string select lines SSL, and the ground select line GSL, electrically connected to the memory blocks BLK1, BLK2, . . . BLKn.

The page buffer 4 may be electrically connected to the memory array region MA through the bit lines BL. The page buffer 4 may be connected to a bit line BL selected according to an address decoded by the column decoder 5. The page buffer 4 may temporarily store data to be stored in memory cells, or may sense data, stored in the memory cell, according to a mode of operation. For example, the page buffer 4 may be operated as a write driver circuit during a mode of programming operation, and may be operated as a sense amplifier circuit during a reading operation mode. The page buffer 4 may receive power (for example, voltage or current) from a control logic, and may provide the power to the bit line BL, having been selected.

The column decoder 5 may provide a data transmission path between the page buffer 4 and an external device (for example, a memory controller). The column decoder 5 may decode address input from an external source, and may thus select one among the bit lines BL.

The column decoder 5 may be commonly connected to the memory blocks BLK1, BLK2, . . . BLKn, and may provide data information to the bit lines BL of the memory block BLK1, BLK2, . . . BLKn, selected according to a block select signal.

The control circuit 6 may control the overall operation of the semiconductor device 1. The control circuit 6 may receive a control signal and an external voltage, and may be operated according to the control signal, having been received. The control circuit 6 may include a voltage generator for generating voltages (for example, programming voltage, reading voltage, erasing voltage, and the like) required for internal operation using an external voltage. The control circuit 6 may control reading, writing, and/or erasing operations in response to the control signals.

Figure 2:
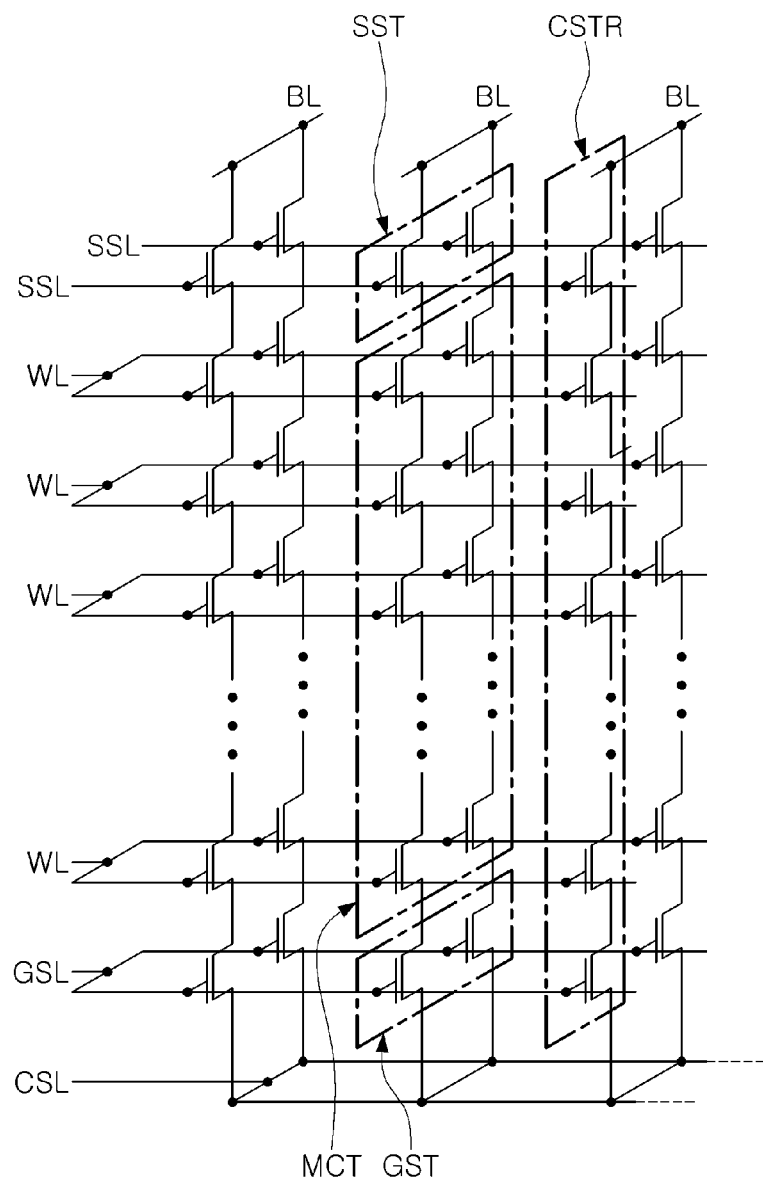
FIG. 2 is a circuit diagram conceptually illustrating a memory array region of a semiconductor device according to an example embodiment.

With reference to FIG. 2, an example of a circuit, disposed in the memory array region (MA of FIG. 1) of the semiconductor device 1, illustrated in FIG. 1, will be described. FIG. 2 is a circuit diagram conceptually illustrating the memory array region (MA in FIG. 1).

Referring to FIGS. 1 and 2, a semiconductor device according to an example embodiment may include a common source line CSL, bit lines BL, and a plurality of cell strings CSTR disposed between the common source line CSL and the bit lines BL. The common source line CSL, the bit lines BL, and the plurality of cell strings CSTR may be disposed in the memory array region MA.

The plurality of cell strings CSTR may be connected to each of the bit lines BL in parallel. The plurality of cell strings CSTR may be commonly connected to the common source line CSL. Each of the plurality of cell strings CSTR may include a lower select transistor GST, memory cells MCT, and an upper select transistor SST, connected in series.

The memory cells MCT may be connected between the lower select transistor GST and the upper select transistor SST in series. Each of the memory cells MCT may include data storage patterns capable of storing data.

The upper select transistor SST may be electrically connected to the bit lines BL, and the lower select transistor GST may be electrically connected to the common source line CSL.

The upper select transistor SST may be provided as a plurality of upper select transistors, and may be controlled by string select lines SSL. The memory cells MCT may be controlled by a plurality of word lines WL.

The lower select transistor GST may be controlled by a ground select line GSL. The common source line CSL may be commonly connected to a source of the ground select transistor GST.

In an example, the upper select transistor SST may be a string select transistor, while the lower select transistor GST may be a ground select transistor.

Figure 3:
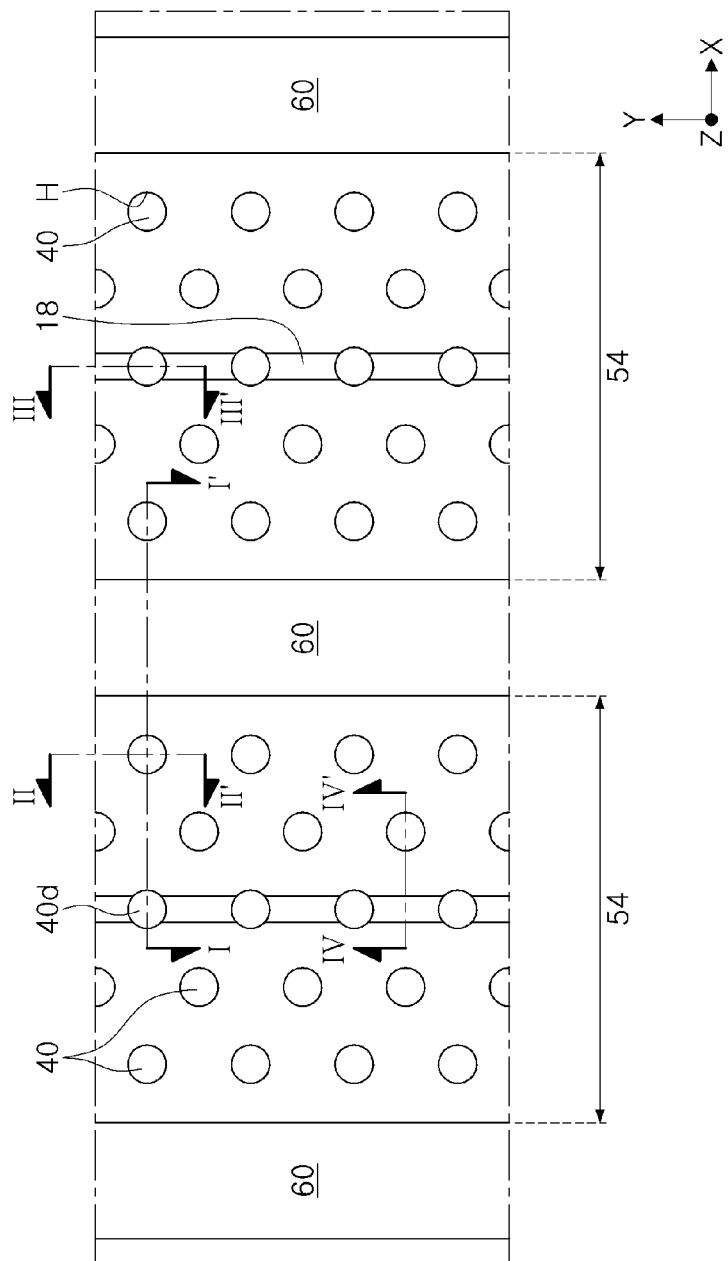
FIG. 3 is a plan view illustrating an example of a semiconductor device according to an example embodiment.
Figure 4A:
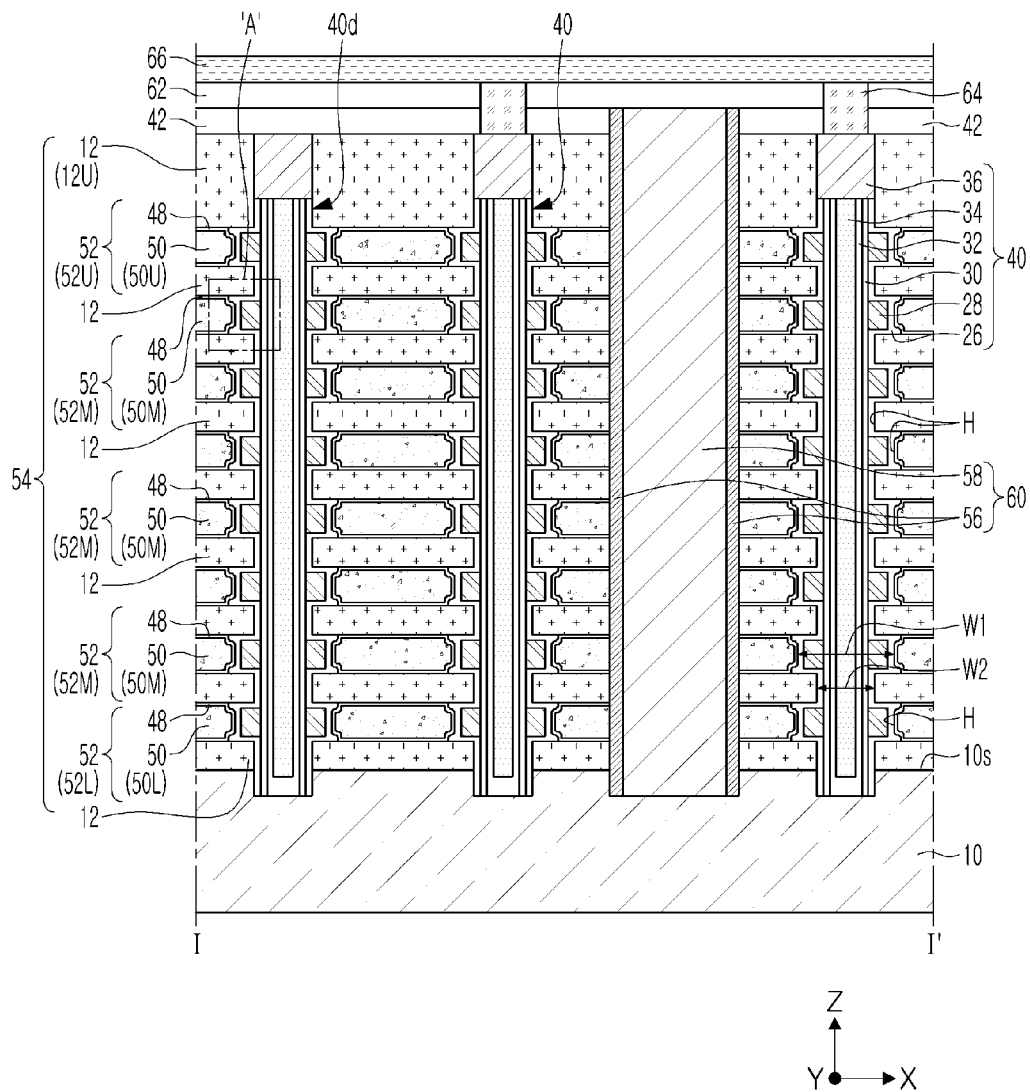
FIGS. 4A and 4B are cross-sectional views illustrating an example of a semiconductor device according to an example embodiment.
Figure 4B:
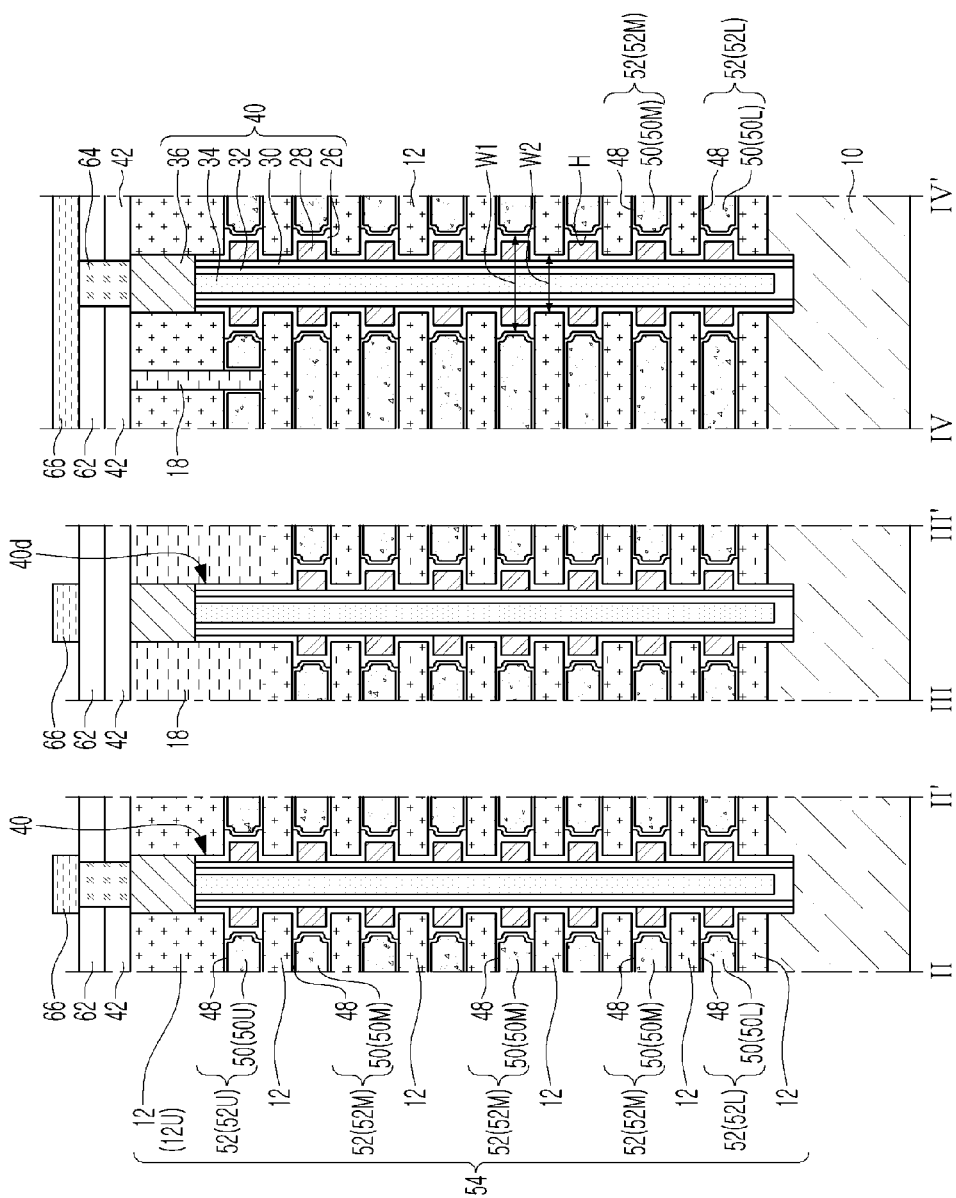
Figure 5A:
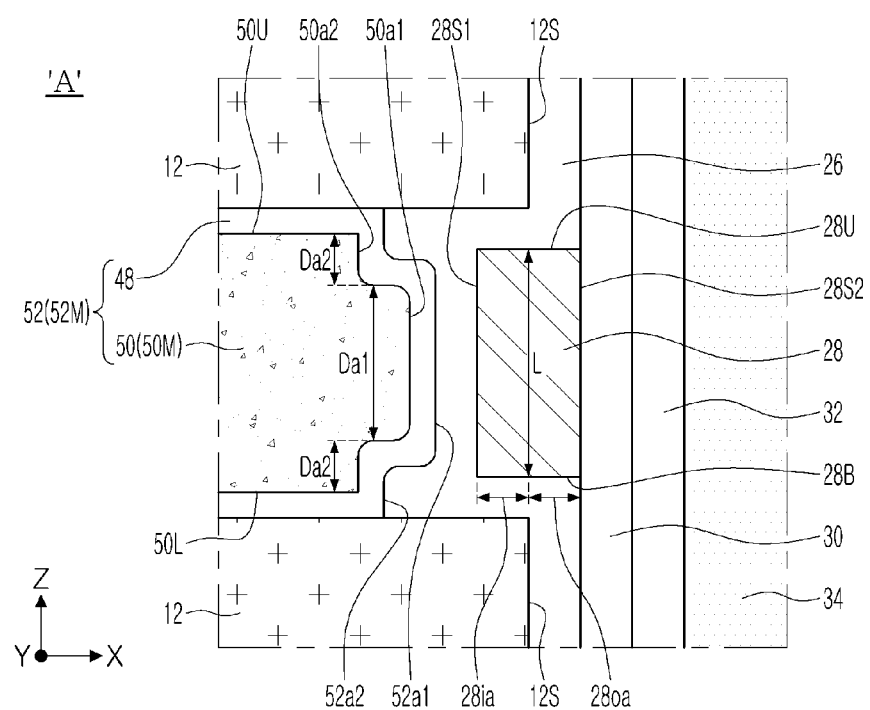
FIGS. 5A to 5E are partially enlarged cross-sectional views illustrating various examples of a semiconductor device according to an example embodiment.

Next, referring to FIGS. 3 to 5A, an example of a semiconductor device according to an example embodiment will be described. In FIGS. 3 to 5A, FIG. 3 is a plan view illustrating an example of a semiconductor device according to an example embodiment, FIG. 4A is a cross-sectional view illustrating a region taken along line I-I' of FIG. 3, FIG. 4B is a cross-sectional view illustrating regions taken along lines III-III', and IV-IV' of FIG. 3, and FIG. 5A is a partially enlarged view illustrating an enlarged portion indicated by 'A' of FIG. 4A.

Referring to FIGS. 3, 4A, 4B, and 5A, a stacked structure 54 may be disposed on a lower structure 10. The lower structure 10 may be a substrate which may be formed of a semiconductor material such as silicon, or the like. The lower structure 10 may be formed of one of a doped semiconductor material (e.g., N-type silicon or P-type silicon, or the like) and a conductive material (e.g., tungsten, or the like) or combinations thereof.

The stacked structure 54 may include interlayer insulating layers 12 and gate patterns 52. The gate patterns 52 may be stacked on the lower structure 10 while being spaced apart from each other in a vertical direction Z, perpendicular to an upper surface 10s of the lower structure 10. Each of the gate patterns 52 may be disposed between the interlayer insulating layers 12. For example, the interlayer insulating layers 12 and the gate patterns 52 may be repeatedly and alternately stacked. The interlayer insulating layers 12 may be formed of silicon oxide.

In an example, the gate patterns 52 may include a lower gate pattern 52L, an upper gate pattern 52U, and intermediate gate patterns 52M between the lower gate pattern 52L and the upper gate pattern 52U. An uppermost interlayer insulating layer 12U, among the interlayer insulating layers 12, may be disposed on the upper gate pattern 52U.

The gate patterns 52 may be extended in a first direction Y parallel to the upper surface 10s of the lower structure 10. An insulating pattern 18, separating the upper gate pattern 52U in a second direction X, may be disposed on the intermediate gate patterns 52M. The insulating pattern 18 may pass through the uppermost interlayer insulating layer 12U and the upper gate pattern 52U.

Memory vertical structures 40, extended in the vertical direction Z, may be disposed on the lower structure 10. The memory vertical structures 40 may be disposed in holes H passing through the stacked structure 54.

The memory vertical structures 40 may pass through the gate patterns 52 and the interlayer insulating layers 12. Dummy vertical structures 40d having the same structure as that of the memory vertical structures 40 may be provided. The dummy vertical structures 40d may pass through the lower gate pattern 52L and the intermediate gate patterns 52M, and may pass through the insulating pattern 18. The memory vertical structures 40 may pass through the lower gate pattern 52L, the intermediate gate patterns 52M, and the upper gate pattern 52U.

Each of the memory vertical structures 40 may include first portions W1 located on a level the same as a level of the gate patterns 52 while passing through the gate patterns 52, and second portions W2 located on a level the same as a level of the interlayer insulating layers 12 while passing through the interlayer insulating layers 12. In each of the memory vertical structures 40, each of the first portions W1 may have a width greater than that of each of the second portions W2.

A first upper insulating layer 42 may be disposed on the stacked structure 54. Separation structures 60, passing through the stacked structure 54 and the first upper insulating layer 42, may be provided. The separation structures 60 may be extended in the first direction Y.

In an example, each of the separation structures 60 may include a separation pattern 58 and spacers 56 on side surfaces of the separation pattern 58. The spacers 56 may be formed of an insulating material, for example, silicon oxide. The separation pattern 58 may be formed of a conductive material.

A second upper insulating layer 62 may be disposed on the first upper insulating layer 42. The first upper insulating layer 42 and the second upper insulating layer 62 may be formed of silicon oxide.

Conductive lines 66 may be disposed on the second upper insulating layer 62. In an example, the conductive lines 66 may be the bit lines (BL of FIGS. 1 and 2), described with reference to FIGS. 1 and 2.

Contact plugs 64 for electrically connecting the conductive lines 66 to the memory vertical structures 40 may be provided. The contact plugs 64 may pass through the first upper insulating layer 42 and the second upper insulating layer 62.

Each of the gate patterns 52 may include a first material layer 48 and a second material layer 50. The first material layer 48 may cover a side surface of the second material layer 50, opposing the memory vertical structures 40 and the dummy vertical structures 40*d* while covering an upper surface and a lower surface of the second material layer 50. The first material layer 48 may be interposed between the second material layer 50 and the memory vertical structure 40 and may be extended between the second material layer 50 and the interlayer insulating layers 12.

In an example, the first material layer 48 may be formed of a dielectric material, and the second material layer 50 may be formed of a conductive material. For example, the first material layer 48 may be formed of a dielectric such as aluminum oxide, and the second material layer 50 may be formed of one or two or more conductive materials among doped silicon, metal nitride (e.g., TiN, or the like), a metal (e.g., Ti, W, or the like) and a metal-semiconductor compound (e.g., TiSi, WSi, or the like).

In another example, the first material layer 48 and the second material layer 50 may be formed of different conductive materials. For example, the first material layer 48 may be formed of metal nitride, and the second material layer 50 may be formed of a metal.

When the first material layer 48 is formed of a dielectric material, and the second material layer 50 is formed of a conductive material, the second material layers 50 of the gate patterns 52 may be gate electrodes 50L, 50M, and 50U. Alternatively, when the first material layer 48 and the second material layer 50 are formed of conductive materials, the gate patterns 52 may be gate electrodes.

Hereinafter, an example in which the first material layer 48 may be formed of a dielectric material, and the second material layer 50 may be formed of a conductive material will be mainly described.

The second material layers 50 of the gate patterns 52 may be gate electrodes 50L, 50M, and 50U. For example, the gate electrodes 50L, 50M, and 50U may include a lower gate electrode 50L, intermediate gate electrodes 50M, and an upper gate electrode 50U. The lower gate pattern 52L may include the lower gate electrode 50L, the intermediate gate patterns 52M may include the intermediate gate electrodes 50M, and the upper gate pattern 52U may include the upper gate electrode 50U.

In an example, the lower gate electrode 50L may be the ground select line GSL, described with reference to FIGS. 1 and 2, the upper gate electrode 50U may be the string select line SSL, described with reference to FIGS. 1 and 2, and the intermediate gate electrodes 50M may be the word lines WL, described with reference to FIGS. 1 and 2.

Throughout the specification, the intermediate gate electrodes 50M, which may be word lines WL described with reference to FIGS. 1 and 2, may be referred to as 'cell gate electrodes'. Throughout the specification, the intermediate gate patterns 52M, including the intermediate gate electrodes 50M which may be the cell gate electrodes, may be referred to as 'cell gate patterns'.

Thus, although there is no mention or explanation below, the intermediate gate pattern 52M may be replaced with a 'cell gate pattern' and described, and the intermediate gate electrode 50M may be replaced with a 'cell gate electrode' and described.

Throughout the specification, the lower gate electrode 50L may be referred to as a 'lower select gate electrode', a 'ground select gate electrode', or a 'ground select line', and the upper gate electrode 50U may be referred to as an 'upper select gate electrode', a 'string select gate electrode', or a 'string select line'. The lower gate pattern 52L, including the lower gate electrode 50L, may be referred to as a 'lower select gate pattern', and the upper gate pattern 52U, including the upper gate electrode 50U, may be referred to as an 'upper select gate pattern'.

Each of the memory vertical structures 40 may include a first dielectric layer 26, data storage patterns 28, a second dielectric layer 30, a channel semiconductor layer 32, a core pattern 34, and a pad pattern 36.

The core pattern 34 may be formed of an insulating material, for example, silicon oxide. The core pattern 34 may pass through the gate patterns 52. The channel semiconductor layer 32 may be extended toward a side surface of the core pattern 34 while covering a bottom surface of the core pattern 34. The channel semiconductor layer 32 may surround an outer side surface of the core pattern 34. The channel semiconductor layer 32 may be formed of silicon. The pad pattern 36 may be disposed on the channel semiconductor layer 32 and the core pattern 34. The pad pattern 36 may be located on a level higher than a level of the upper gate pattern 52U. The pad pattern 36 may be formed of silicon having N-type conductivity.

The second dielectric layer 30 may be disposed between the channel semiconductor layer 32 and the stacked structure 54. The first dielectric layer 26 may be disposed between the second dielectric layer 30 and the stacked structure 54. The second dielectric layer 30 may be a tunnel dielectric layer. The second dielectric layer 30 may include silicon oxide and/or impurity-doped silicon oxide.

The first dielectric layer 26 may be a blocking dielectric layer. The first material layer 48 may have a thickness, thinner than a thickness of the first dielectric layer 26. The first material layer 48 may be formed of a high-k dielectric having a dielectric constant, higher than a dielectric constant of the first dielectric layer 26. For example, the first material layer 48 may be formed of silicon oxide, and the first dielectric layer 26 may be formed of a high-k dielectric such as aluminum oxide, having a dielectric constant, greater than a dielectric constant of silicon oxide.

In each of the memory vertical structures 40, the data storage patterns 28 disposed in the first portions W1 may be spaced apart from each other in the vertical direction Z, and may be disposed between the first dielectric layer 26 and the second dielectric layer 30.

Each of the data storage patterns 28 may include an overlapping portion 28*ia*, overlapping the interlayer insulating layers 12 in the vertical direction Z, and a non-overlapping portion 28*oa*, not overlapping the interlayer insulating layers 12 in the vertical direction Z. The overlapping portion 28*ia* may be referred to as an inner region, and the non-overlapping portion 28*oa* may be referred to as an outer region.

In each of the memory vertical structures 54, the first dielectric layer 26, the second dielectric layer 30, and the channel semiconductor layer 32 may be sequentially disposed on side surfaces 50*a*1 and 50*a*2 of the intermediate gate patterns 52M exposed by the hole H, which may be word lines (WL of FIGS. 1 and 2), that is, cell gate patterns, and may be extended toward side surfaces 12S of the interlayer insulating layers 12 exposed by the hole H. In each of the memory vertical structures 54, the data storage patterns 28 may be disposed in the first portions W1 of each of the memory vertical structures 54.

The first dielectric layer 26 and the second dielectric layer 30 may be separated from each other by the data storage patterns 28 while being in contact with each other on a level the same as a level of the interlayer insulating layers 12. For example, the first dielectric layer 26 and the second dielectric layer 30 may be extended toward a side surface of the cell gate patterns 52M while being in contact with each other on a level the same as a level of the interlayer insulating layers 12. The first dielectric layer 26 may cover upper surfaces 28U of the data storage patterns 28, lower surfaces 28B of the data storage patterns 28, and first side surfaces 28S1 of the data storage patterns 28, opposing the cell gate patterns 52M, and the second dielectric layer 30 may cover second side surfaces 28S2 of the data storage patterns 28, opposing the first side surfaces 28S1 of the data storage patterns 28. The first dielectric layer 26 may be in contact with upper surfaces 28U of the data storage patterns 28, lower surfaces 28B of the data storage patterns 28, and first side surfaces 28S1 of the data storage patterns 28, and the second dielectric layer 30 may be in contact with second side surfaces 28S2 of the data storage patterns 28.

The data storage patterns 28 may be formed of a material capable of storing data. For example, the data storage patterns 28 may be formed of silicon nitride. The material, capable of storing data, and forming the data storage patterns 28, may not be limited to silicon nitride, and may be replaced with other materials. For example, the data storage patterns 28 may be formed of polysilicon.

The data storage patterns 28, disposed between the channel semiconductor layer 32 and the intermediate gate electrodes 50M, which may be word lines (WL of FIGS. 1 and 2), may be data storage regions. For example, depending on operating conditions of a non-volatile memory device such as a flash memory device, an electron, injected from the channel semiconductor layer 32 into the data storage patterns 28 through the second dielectric layer 30, may be trapped to be retained, or the electron, trapped in the data storage patterns 28, may be erased. Thus, the data storage patterns 28 may form the memory cells MCT, described with reference to FIG. 2.

In an example, each of the gate electrodes 50, for example, the side surface 50a1 and 50a2 of each of the cell gate electrodes 50M, may have recess portions 50a2 and a protruding portion 50al, opposing the memory vertical structures 40. Each of the data storage patterns 28 may oppose the protruding portion 50a1 of each of the cell gate electrodes 50M. Recess portions 52a2 of each of the cell gate electrodes 50M may be adjacent to the interlayer insulating layers 12. In each of the cell gate electrodes 50M, the protruding portion 50a1 may have a shape protruding in a direction toward the memory vertical structure 40 between the recess portions 50a2. A length L of each of the data storage patterns 28 in the vertical direction Z may be greater than a length Da1 of the protruding portion 50a1 of each of the cell gate electrodes 50M in the vertical direction Z. A length Da1 of the protruding portion 50a1 of each of the cell gate electrodes 50M in the vertical direction Z may be greater than a length Da2 of the recess portions 50a2 of each of the cell gate electrodes 50M in the vertical direction Z.

When the cell gate electrodes 50M are the word lines WL, described previously, the protruding portion 50a1 of each of the cell gate electrodes 50M may improve a performance of the semiconductor device.

In a manner similar to the gate electrodes 50, each of the gate patterns 52, for example, each of the cell gate patterns 52M may have a protruding portion 52a1 and recess portions 52a2, opposing the memory vertical structures 40. Each of the data storage patterns 28 may oppose the protruding portion 52a1 of each of the cell gate patterns 52M. A length L of each of the data storage patterns 28 in the vertical direction Z may be greater than a length of the protruding portion 52a1 of each of the cell gate patterns 52M in the vertical direction Z.

A shape of the gate patterns 52, opposing each other, and opposing regions between the memory vertical structures 40 may be not limited to that described with reference to FIGS. 4A to 5A, and may be variously modified. Hereinafter, various modified examples of the gate patterns 52, opposing each other, and opposing regions between the memory vertical structures 40 will be described with reference to partially enlarged views of FIGS. 5B to 5E, illustrating a single gate pattern 52 located between a pair of interlayer insulating layers 12, adjacent to each other in the vertical direction Z, and a portion of the memory vertical structure 40, opposing the single gate pattern 52. Here, when describing with reference to partially enlarged views of FIGS. 5B to 5E, the components described with reference to FIGS. 4A to 5A will be described by referring directly without any explanation.

Figure 5B:
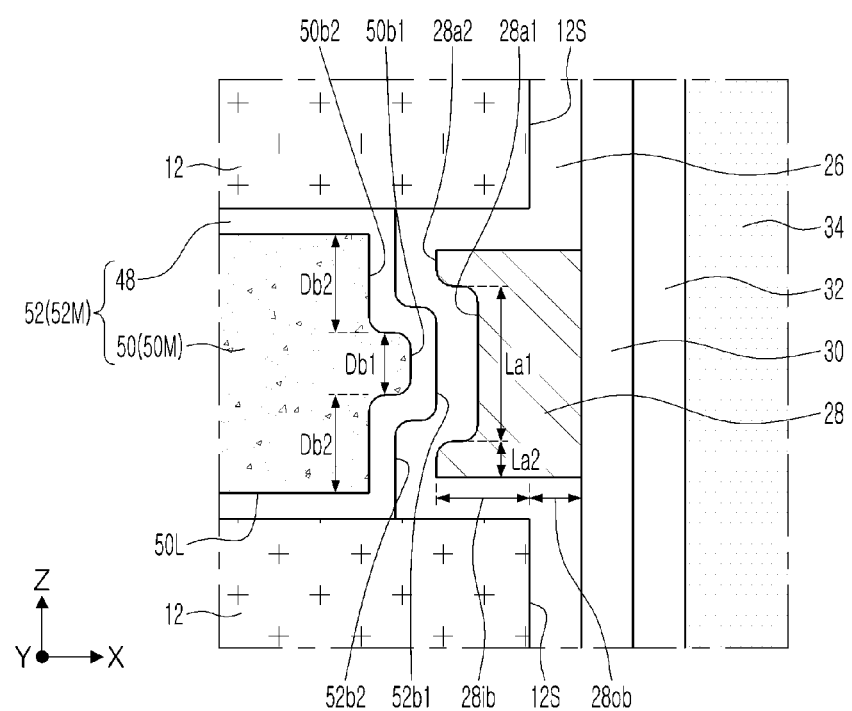

In a modified example, referring to FIG. 5B, the gate pattern 52, located between the interlayer insulating layers 12, for example, the cell gate pattern 52M may include a protruding portion 52b1 and recess portions 52b2, opposing the first dielectric layer 26. The data storage pattern 28, opposing the cell gate pattern 52M, may include a recess portion 28a1 opposing the protruding portion 52b1 of the cell gate pattern 52M and protruding portions 28a2 opposing the recess portions 52b2 of the cell gate pattern 52M.

The protruding portions 28a2 of the data storage pattern 28 may protrude toward the cell gate pattern 52M in a horizontal direction, and the protruding portion 52b1 of the cell gate pattern 52M may protrude toward the data storage pattern 28 in a horizontal direction.

A length La1 of the recess portion 28a1 of the data storage pattern 28 in the vertical direction Z may be greater than a length La2 of each of the protruding portions 28a2 of the data storage pattern 28. A length La1 of the recess portion 28a1 of the data storage pattern 28 in the vertical direction Z may be greater than a length Db1 of the protruding portion 52b1 of the cell gate pattern 52M in the vertical direction Z.

In a manner similar to the cell gate pattern 52M, the cell gate electrode 50M of the cell gate pattern 52M may have a protruding portion 50b1 and recess portions 50b2. A length Db1 of the protruding portion 50b1 of the cell gate electrode 50M in the vertical direction Z may be smaller than a length Db2 of each of the recess portions 50b2 of the cell gate electrode 50M.

The data storage pattern 28 may include an overlapping portion 28ib, overlapping the interlayer insulating layers 12 in the vertical direction Z, and a non-overlapping portion 28ob, not overlapping the interlayer insulating layers 12 in the vertical direction Z. In the data storage pattern 28, the overlapping portion 28ib may have a width greater than a width of the non-overlapping portion 28ob.

Figure 5C:
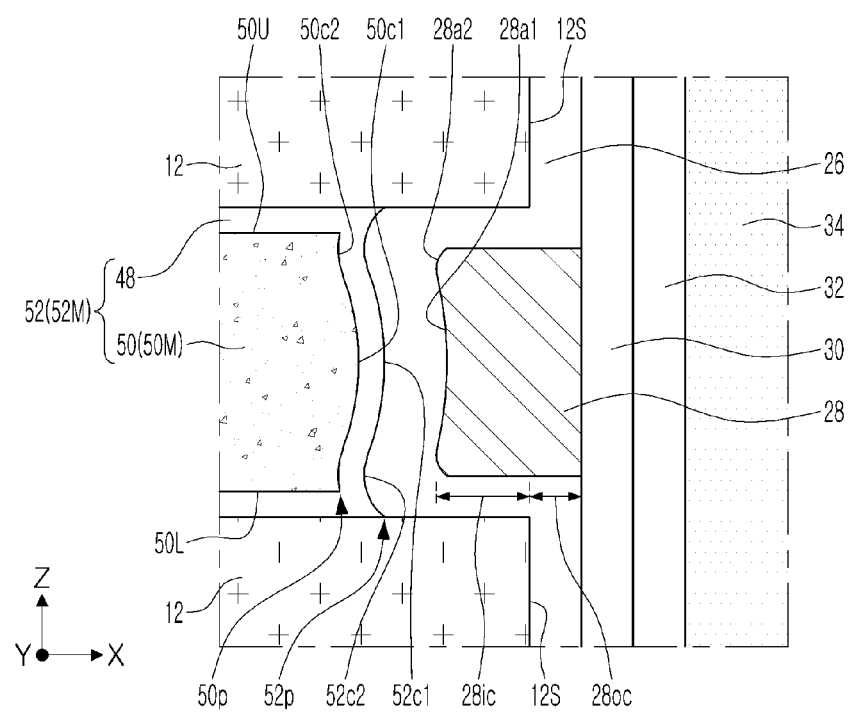

In another modified example, referring to FIG. 5C, the cell gate pattern 52M, located between the interlayer insulating layers 12, may include a central protruding portion 52c1 in a curved form, convex in a horizontal direction toward the data storage pattern 28, edge protruding portions 52p adjacent to the interlayer insulating layers 12, and recess portions 52c2 in a concave form, located between the edge protruding portions 52p and the central protruding portion 52c1. Each of the edge protruding portions 52p may have a horizontal surface in contact with the interlayer insulating layers 12, and a side surface, forming an acute angle with the horizontal surface.

The data storage pattern 28 may include a recess portion 28a1 in a curved form, opposing the central protruding portion 52c1 of the cell gate pattern 52M, and protruding portions 28a2 in a curved form, opposing the recess portions 52c2 of the cell gate pattern 52M.

The data storage pattern 28 may include an overlapping portion 28ic, overlapping the interlayer insulating layers 12 in the vertical direction Z, and a non-overlapping portion 28oc, not overlapping the interlayer insulating layers 12 in the vertical direction Z. In the data storage pattern 28, the overlapping portion 28ic may have a width greater than a width of the non-overlapping portion 28oc.

In a manner similar to the cell gate pattern 52M, the cell gate electrode 50M of the cell gate pattern 52M may include a central protruding portion 50c1 in a curved form, convex in a horizontal direction toward the data storage pattern 28, edge protruding portions 50p adjacent to the interlayer insulating layers 12, and recess portions 50c2 in a concave curved form, located between the edge protruding portions 50p and the central protruding portion 50c1.

Figure 5D:
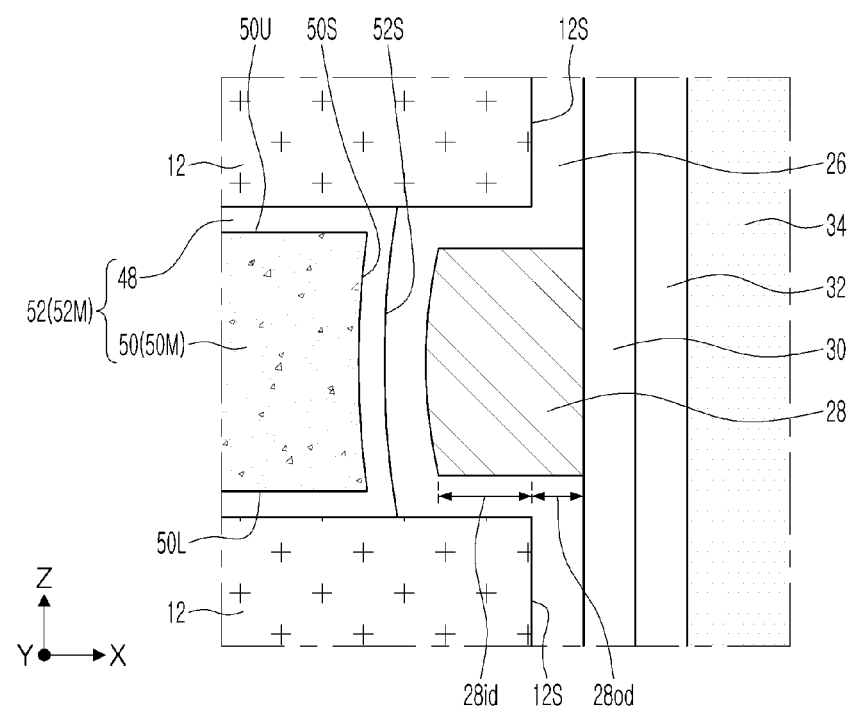

In another modified example, referring to FIG. 5D, the cell gate pattern 52M, located between the interlayer insulating layers 12, may have a side surface 52S, concave in a direction toward the cell gate pattern 52M from the data storage pattern 28 between the interlayer insulating layers 12. In a manner similar to the cell gate pattern 52M, the cell gate electrode 50M of the cell gate pattern 52M may have a side surface 50S, which is concave.

The data storage pattern 28 may include an overlapping portion 28id, overlapping the interlayer insulating layers 12 in the vertical direction Z, and a non-overlapping portion 28od, not overlapping the interlayer insulating layers 12 in the vertical direction Z. In the data storage pattern 28, the overlapping portion 28id may have a width greater than a width of the non-overlapping portion 28od.

Figure 5E:
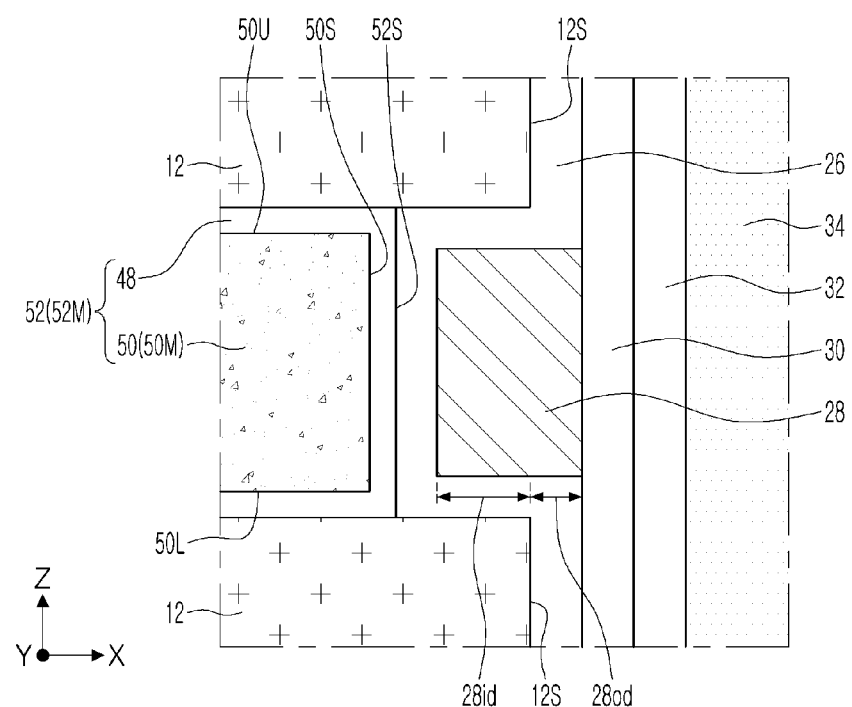

In another modified example, referring to FIG. 5E, the side surface 52S of the cell gate pattern 52M, located between the interlayer insulating layers 12, may be perpendicular to a surface of the interlayer insulating layer 12, in contact with the cell gate pattern 52M. In a manner similar to the cell gate pattern 52M, the side surface 50S of the cell gate electrode 50M of the cell gate pattern 52M may be perpendicular thereto.

As described above, the cell gate patterns 52M may be provided to have various side profiles, as illustrated in FIGS. 5A to 5E. Thus, a semiconductor device having various characteristics may be provided to a semiconductor designer, so the semiconductor designer may design a semiconductor integrated circuit using a semiconductor device including a cell gate pattern of one among the cell gate patterns 52M, described with reference to FIGS. 5A to 5E.

Next, referring to FIGS. 6A and 6B, a modified example of a semiconductor device according to an example embodiment will be described.

Figure 6A:
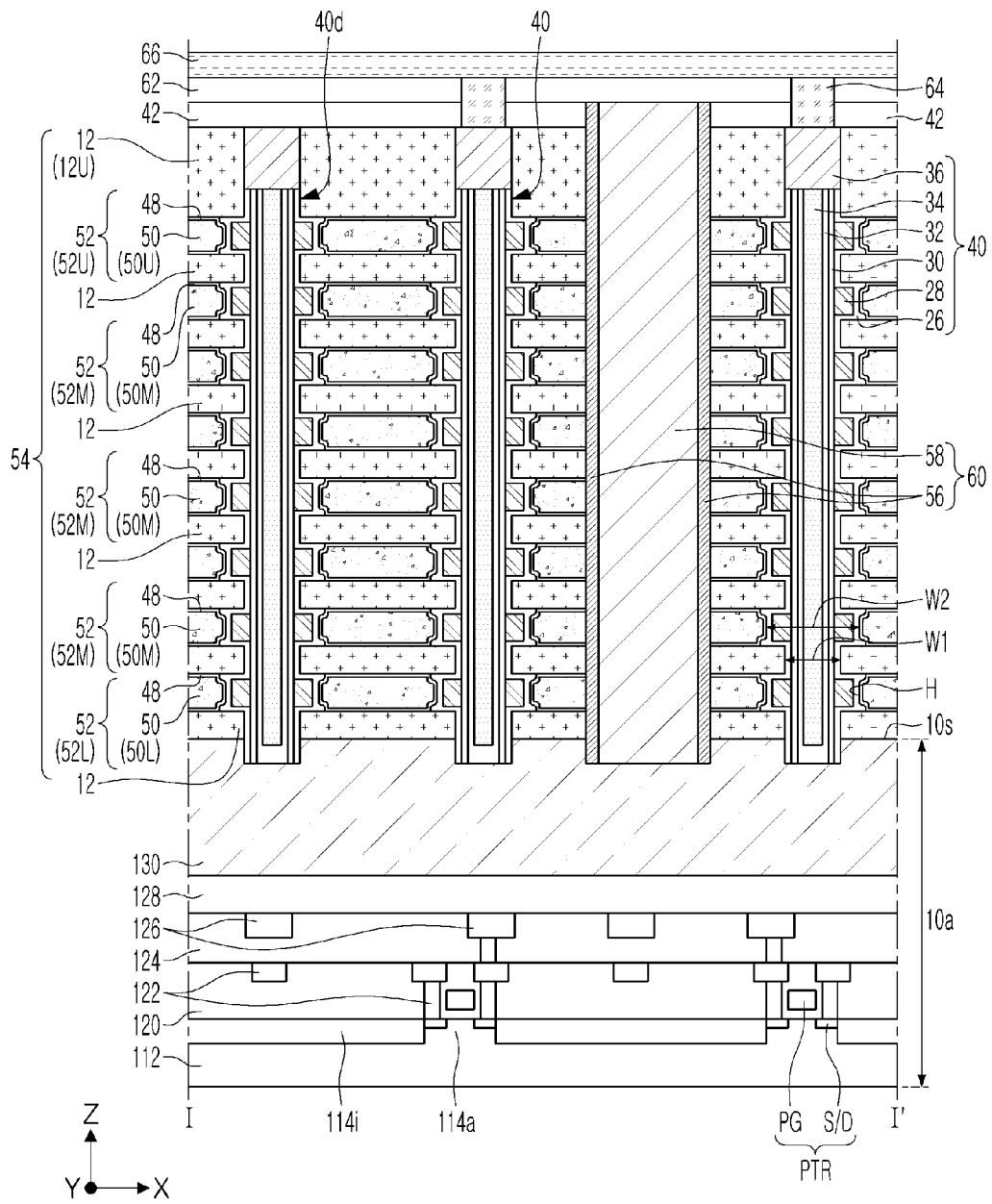
FIG. 6A is a cross-sectional view illustrating a modified example of a semiconductor device according to an example embodiment.

In a modified example, referring to FIG. 6A, a lower structure 10a, including a first substrate 112, a second substrate 130 on the first substrate 112, and a peripheral circuit region between the first substrate 112 and the second substrate 130, may be provided.

In an example, the first substrate 112 may include a single crystal silicon substrate.

In an example, the second substrate 130 may include a polysilicon substrate.

An element separation region 114i, formed on the first substrate 112 and defining a peripheral active region 114a, may be provided.

The peripheral circuit region of the lower structure 10a may include a peripheral transistor PTR, including a source/drain S/D, formed on the peripheral active region 114a, and a peripheral gate PG, a first lower insulating layer 120 on the first substrate 112, first peripheral wirings 122 embedded in the first lower insulating layer 120, a second lower insulating layer 124 on the first lower insulating layer 120, second peripheral wirings 126 embedded in the second lower insulating layer 124, and a third lower insulating layer 128 on the second lower insulating layer 124.

Figure 6B:
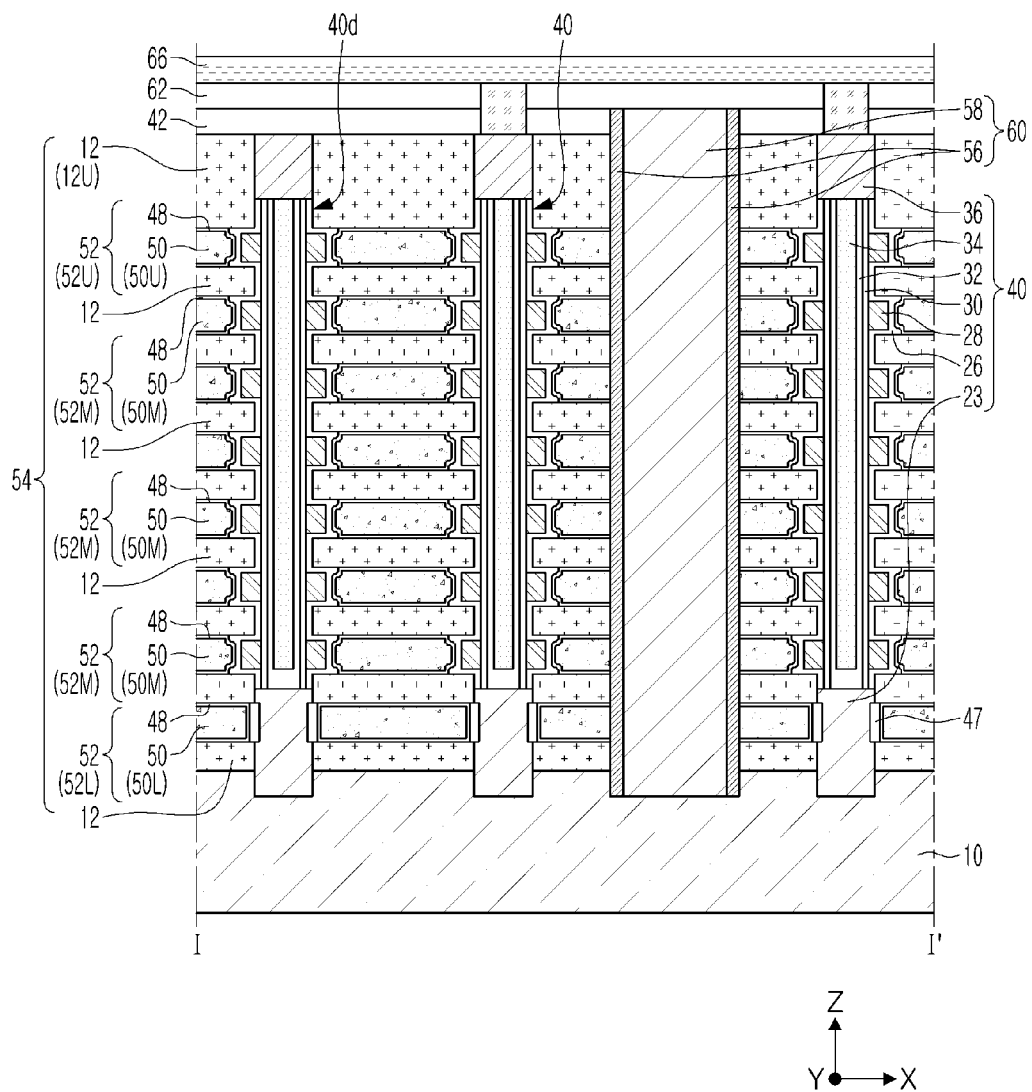
FIG. 6B is a cross-sectional view illustrating another modified example of a semiconductor device according to an example embodiment.

In a modified example, referring to FIG. 6B, the memory vertical structure 40, described above, may further include a semiconductor pattern 23. The semiconductor pattern 23 may oppose a lower gate pattern 52L, among the gate patterns 52, and may be disposed on a level lower than a level of the intermediate gate patterns 52M. The memory vertical structure 40 may include the first dielectric layer 26, the data storage patterns 28, the second dielectric layer 30, the channel semiconductor layer 32, the core pattern 34, and the pad pattern 36, which are the same as described above. The channel semiconductor layer 32 may be in contact with the semiconductor pattern 23.

The semiconductor pattern 23 may be epitaxially grown from the lower structure 10. An additional dielectric layer 47, for example, a silicon oxide layer may be disposed between the lower gate pattern 52L and the semiconductor pattern 23.

Figure 6C:
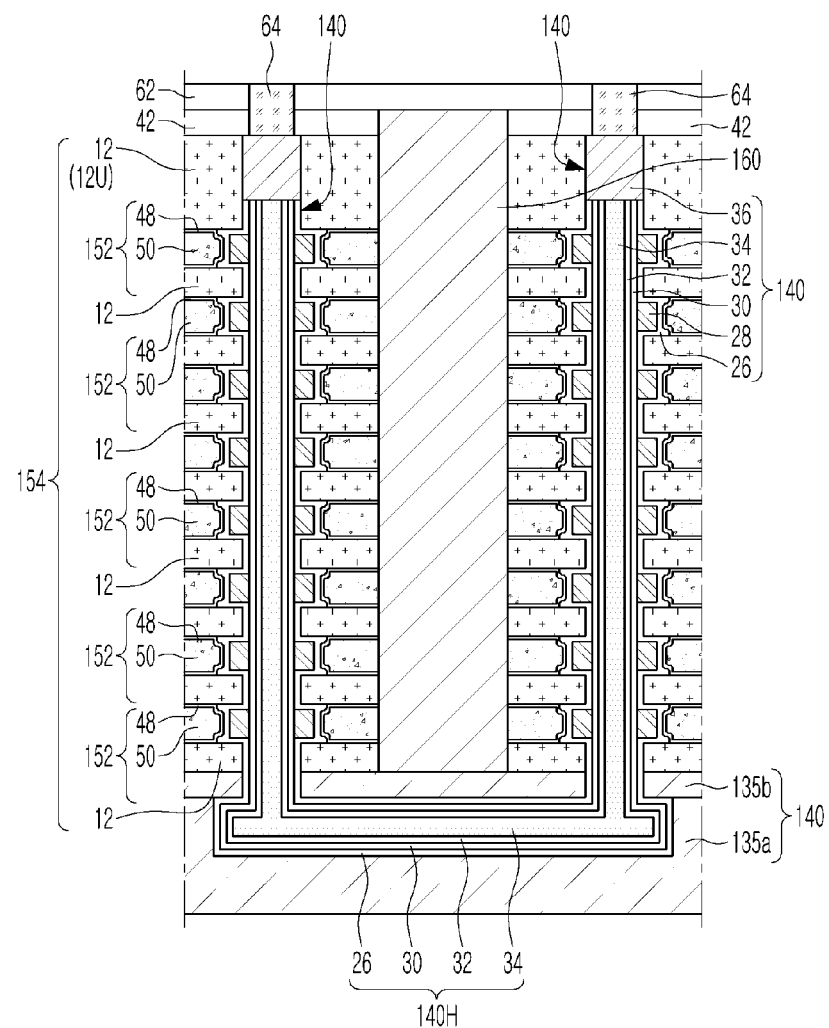
FIG. 6C is a cross-sectional view illustrating another modified example of a semiconductor device according to an example embodiment.
Figure 7A:
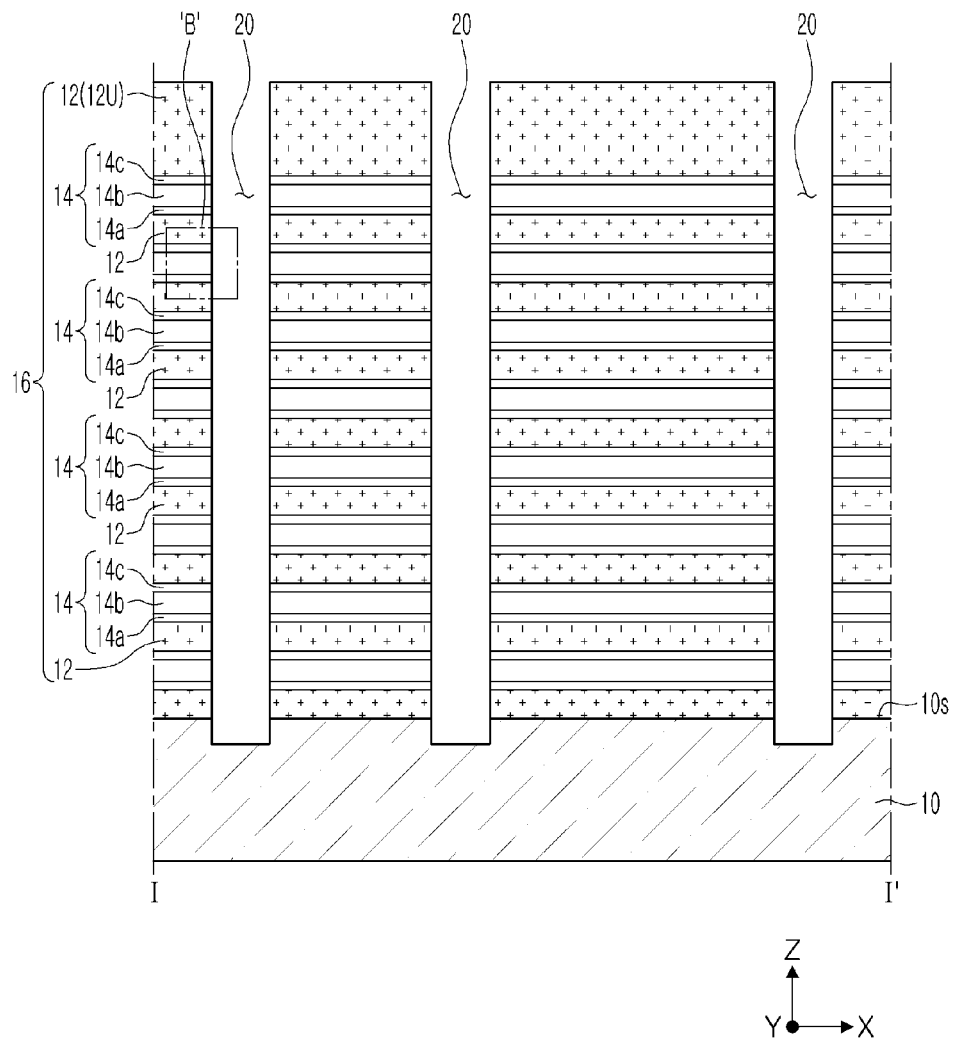
FIGS. 7A and 13B are drawings illustrating an example of a method of forming a semiconductor device according to an example embodiment.
Figure 7B:
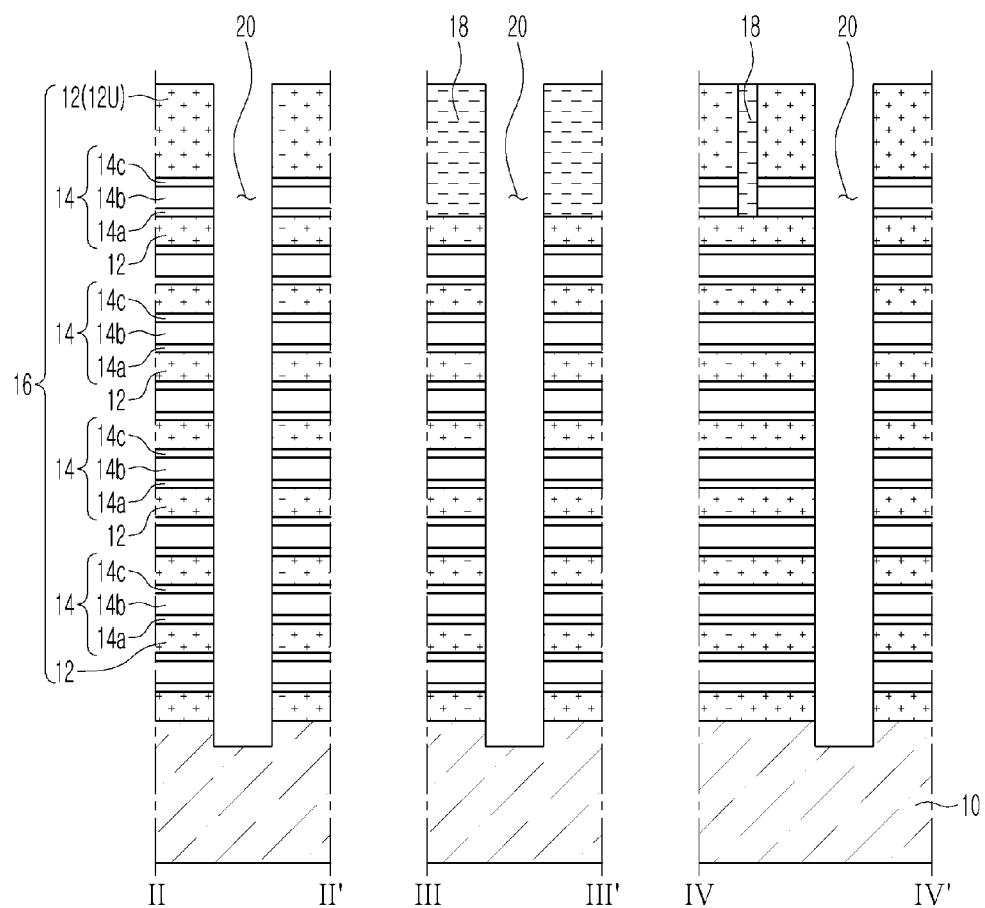

In a modified example, referring to FIG. 6C, a stacked structure 154 may be disposed on a lower structure 140. The stacked structure 154 may include the interlayer insulating layers 12, which is the same as described above. The stacked structure 154 may include gate patterns 152 interposed between the interlayer insulating layers 12. Each of the gate patterns 152 may include the first material layer 48 and the second material layer 50, which are the same as described above. A first upper insulating layer 42 and a second upper insulating layer 62, sequentially stacked on the stacked structure 154, may be provided. Separation structures 160, passing through the stacked structure 154 and the first upper insulating layer 42, may be provided. The separation structures 160 may include an insulating material, for example, a silicon oxide.

Memory vertical structures 140, passing through the stacked structure 154, may be provided. The memory vertical structures 140 may be connected to each other by a connection portion 140H in the lower structure 140. For example, each of the memory vertical structures 140 may include the first dielectric layer 26, the data storage patterns 28, the second dielectric layer 30, the channel semiconductor layer 32, the core pattern 34, and the pad pattern 36, the same as those described with reference to FIGS. 4A and 4B, in the stacked structure 154, and the first dielectric layer 26, the second dielectric layer 30, the channel semiconductor layer 32, and the core pattern 34 may be extended toward the lower structure 140 to form the connection portion 140H. Thus, the memory vertical structures 140 may be connected to each other by the connection portion 140H. In an example, the connection portion 140H may be disposed below the separation structure 160.

In an example, the lower structure 140 may include a first lower layer 135a and a second lower layer 135b on the first lower layer 135a. The first lower layer 135a and the second lower layer 135b may be formed of silicon, for example, doped silicon.

Next, an example of a method of forming a semiconductor device according to an example embodiment will be described with reference to FIG. 3 and FIGS. 7A to 14B. In FIGS. 7A to 14B, FIGS. 7A, 9A, 11A, and 12A are cross-sectional views illustrating a region taken along line I-I' of FIG. 3, FIGS. 7B, 9B, 11B, and 12B are cross-sectional views illustrating regions taken along line II-IP, and IV-IV' of FIG. 3, and FIG. 8A is a partially enlarged view illustrating an enlarged portion indicated by 'B' of FIG. 7A.

Referring to FIGS. 3, 7A, 7B, and 8A, a mold structure 16 may be disposed on a lower structure 10. The lower structure 10 may include a semiconductor substrate. The mold structure 16 may include interlayer insulating layers 12 and gate patterns 14, alternately and repeatedly stacked. In the mold structure 16, an uppermost layer 12U may be the interlayer insulating layer. The interlayer insulating layers 12 may be formed of silicon oxide, and the gate layers 14 may be formed of a material having an etch selectivity different from the etch selectivity of the interlayer insulating layers 12.

Each of the gate layers 14 may be formed of a first layer 14a, a second layer 14b, and a third layer 14c, sequentially stacked.

Figure 8A:
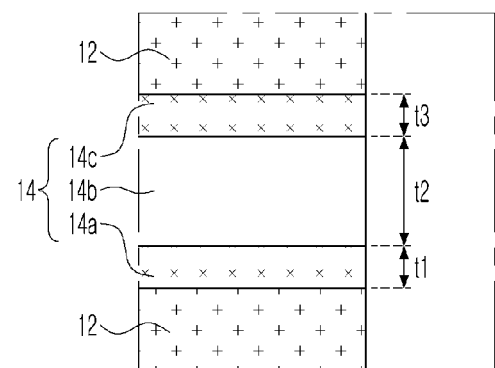

In an example, as illustrated in FIG. 8A, a thickness t1 of the first layer 14a and a thickness t3 of the third layer 14c may be smaller than a thickness t2 of the second layer 14b.

Figure 8B:
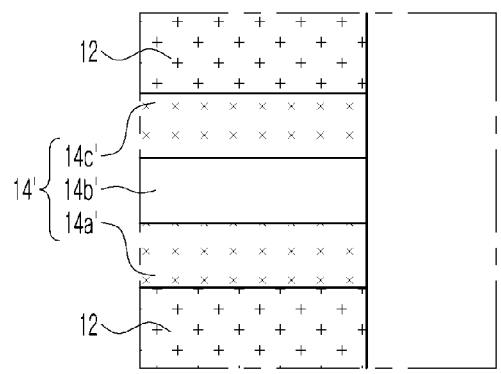

In a modified example, as illustrated in FIG. 8B, each of the gate layers 14 may be formed of a first layer 14a', a second layer 14b', and a third layer 14c', having substantially the same thickness and sequentially stacked. Here, FIG. 8B is a partially enlarged view corresponding to FIG. 8A.

Again, referring to FIGS. 3, 7A, 7B, and 8A, an insulating pattern 18 having a line shape, passing through a portion of the stacked structure 16, may be provided. For example, the insulating pattern 18 may pass through an interlayer insulating layer 12U in an uppermost portion among the interlayer insulating layers 12, and a gate layer 14 in an uppermost portion among the gate layers 14, and may have a line shape, when viewed in a plane. The insulating pattern 18 may be formed of silicon oxide.

Holes 20, passing through the stacked structure 16, may be provided. Some of the holes 20 may pass through the insulating pattern 18. The holes 20 may expose the lower structure 10.

Figure 9A:
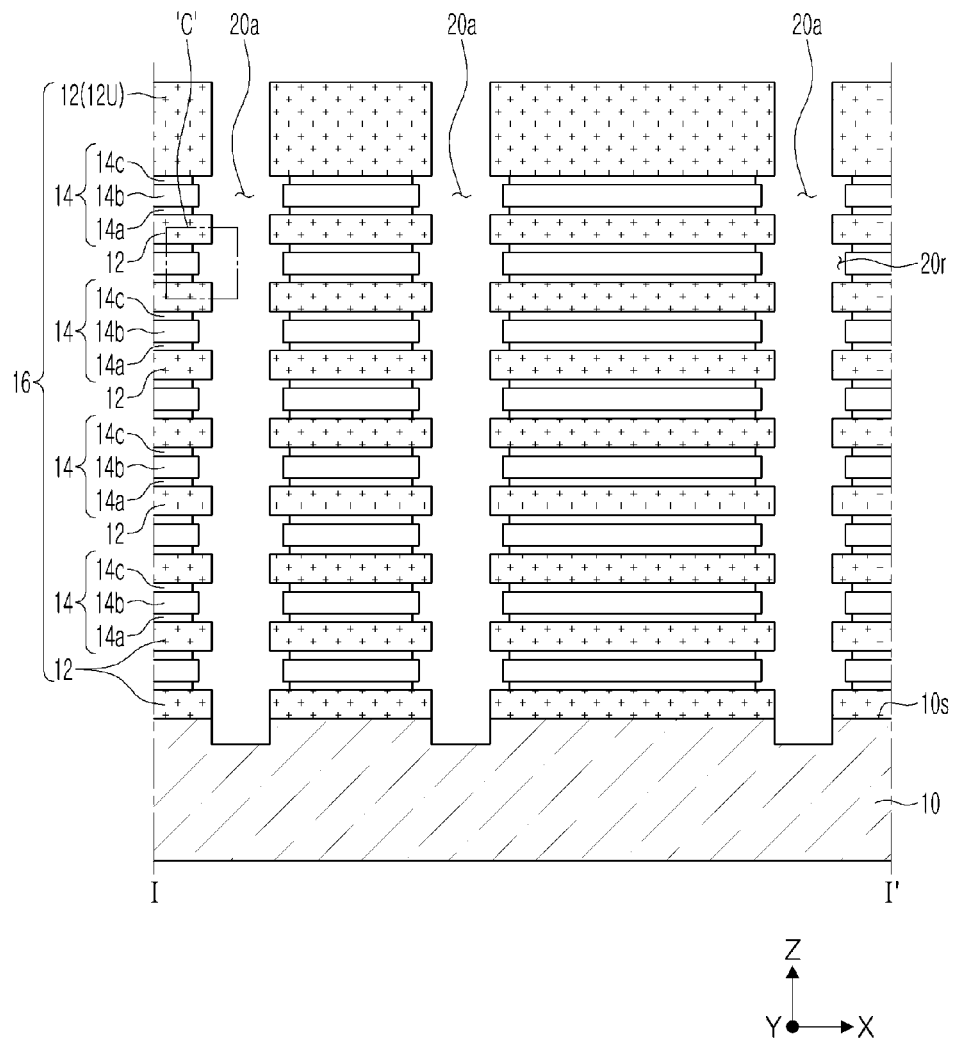
Figure 9B:
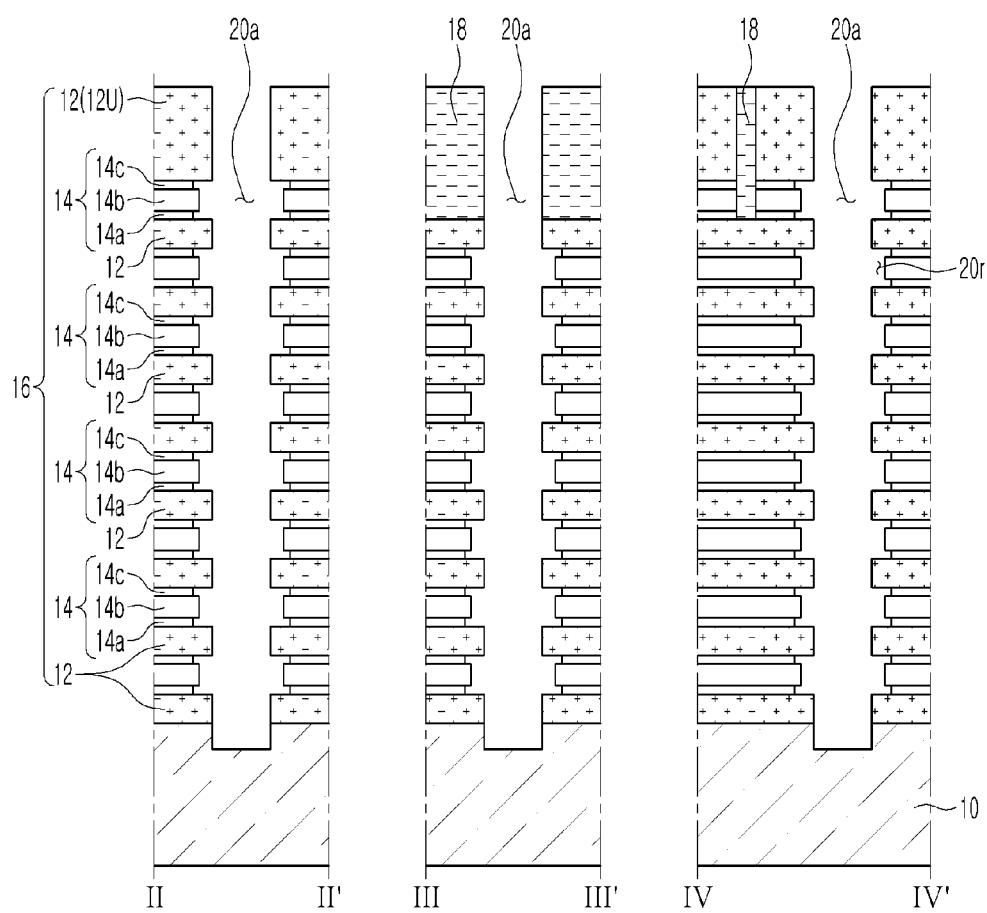

Referring to FIGS. 3, 9A, and 9B, the gate layers 14, exposed by the holes 20, are partially etched using a first etching process to form recess regions 20r. The holes 20 may be provided as extended holes 20a.

Side surfaces of the gate layers 14, formed by partially etching the gate layers 14 exposed by the holes 20, may be formed to have a curved shape, as compared with side surfaces of the gate layers 14, exposed while forming the holes 20, exposing the interlayer insulating layers 12 and the gate layers 14 while passing through the mold structure 16.

The first layer 14a and the third layer 14c may be formed of the same first material, and the second layer 14b may be formed of a second material having an etch selectivity with respect to the first material. For example, the second material of the second layer 14b may be a material having an etching rate, lower than an etching rate of the first material, of the first layer 14a and the third layer 14c.

In an example, the second material, of the second layer 14b, and the first material, of the first layer 14a and the third layer 14c, may be formed of different materials, having an etch selectivity with respect to the interlayer insulating layers 12. For example, the second material may be formed of silicon nitride, and the first material may be formed of silicon. Thus, the second layer 14b may be etched slower, as compared with the first layer 14a and the third layer 14c.

Figure 10A:
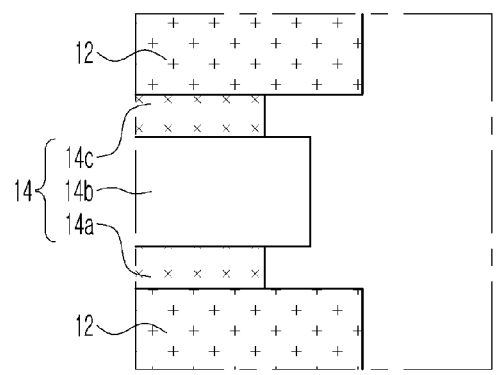

In an example, the second material, of the second layer 14b, and the first material, of the first layer 14a and the third layer 14c, may be commonly formed of silicon nitride (SiN) and the second material may be formed of silicon nitride having a content of silicon, lower than that of the first material. Thus, by the first etching process performed using etchant for selectively etching silicon nitride, for example, sulfuric acid, the second layer 14b may be etched slower, as compared with the first layer 14a and the third layer 14c. As a difference in a content of silicon, contained in the second material and the first material, is larger, a speed at which the first layer 14a and the third layer 14c are etched may be greater than a speed at which the second layer 14b is etched. In this regard, the first layer 14a and the third layer 14c are etched faster. Thus, as illustrated in FIG. 10A, the second layer 14b may be provided in the relatively protruding form, as compared with the first layer 14a and the third layer 14c.

Figure 10B:
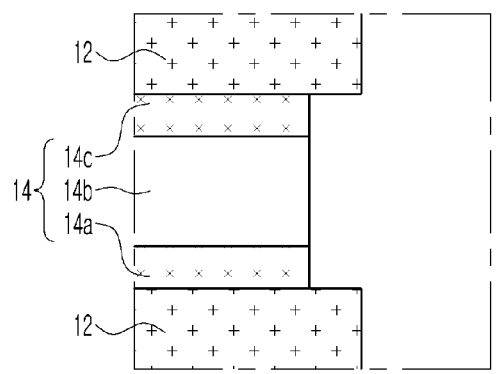

In another example, a difference in a content of silicon, contained in the second material and the first material, is adjusted or smaller, to adjust speeds, at which the second layer 14b, as well as the first layer 14a and the third layer 14c are etched. In this regard, as illustrated in FIG. 10B, the second layer 14b, as well as the first layer 14a and the third layer 14c may be allowed to be etched at substantially the same speed. Here, FIGS. 10A and 10B are partially enlarged views illustrating various examples of a side surface of the gate layer 14, which may be provided in a portion indicated by 'C' of FIG. 9A. Here, a shape of a side surface of the gate layer 14, described with reference to FIGS. 10A and 10B, may be illustrated by way of example to describe an example embodiment. Thus, according to an example embodiment, various shapes of a side surface of the gate pattern 52M, illustrated in FIGS. 5A to 5D, may be formed, by adjusting etching speeds between the second layer 14b, as well as the first layer 14a and the third layer 14c, or by adjusting a ratio of thicknesses between the second layer 14b, as well as the first layer 14a and the third layer 14c, as illustrated in FIG. 8B. Here, a shape of a side surface formed by etching the gate layer 14, including the first to third layers 14a, 14b, and 14c, may be provided as a shape of a side surface of the gate pattern 52M, illustrated in FIGS. 5A to 5D.

Figure 11A:
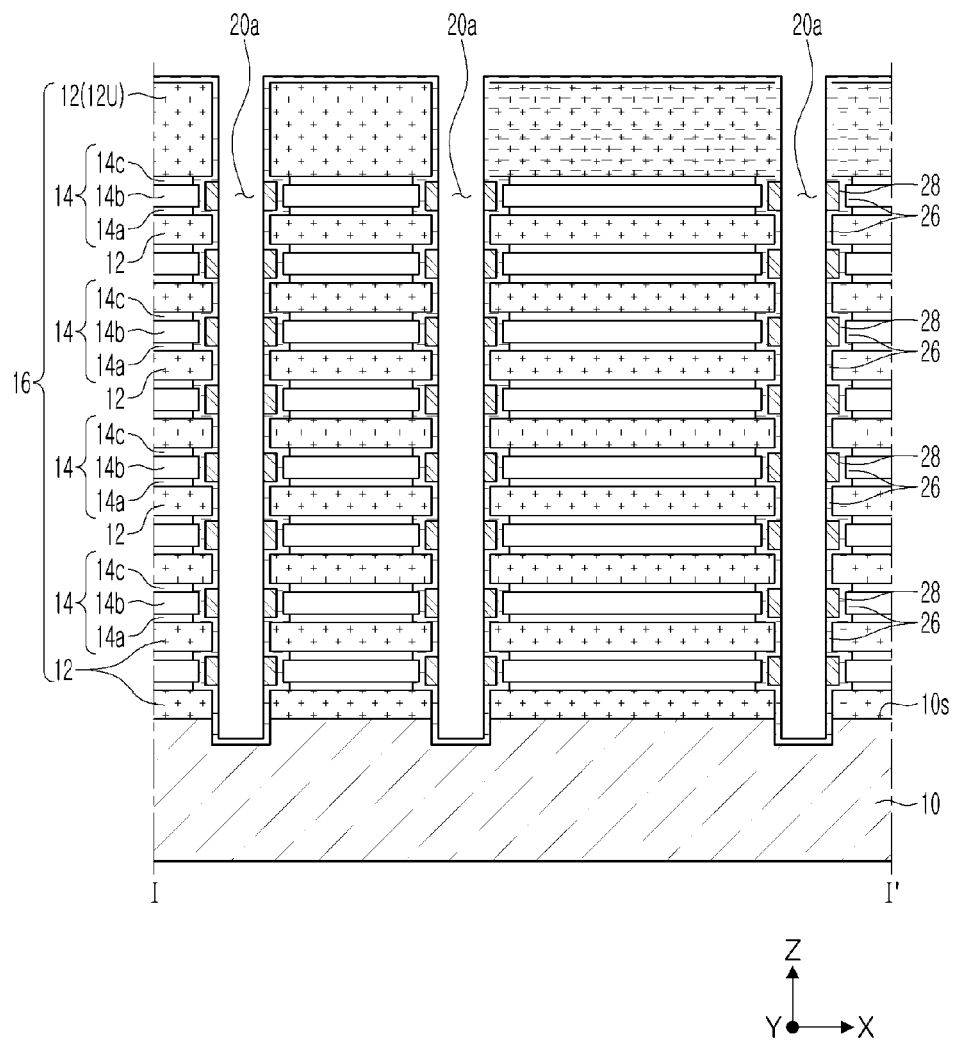
Figure 11B:
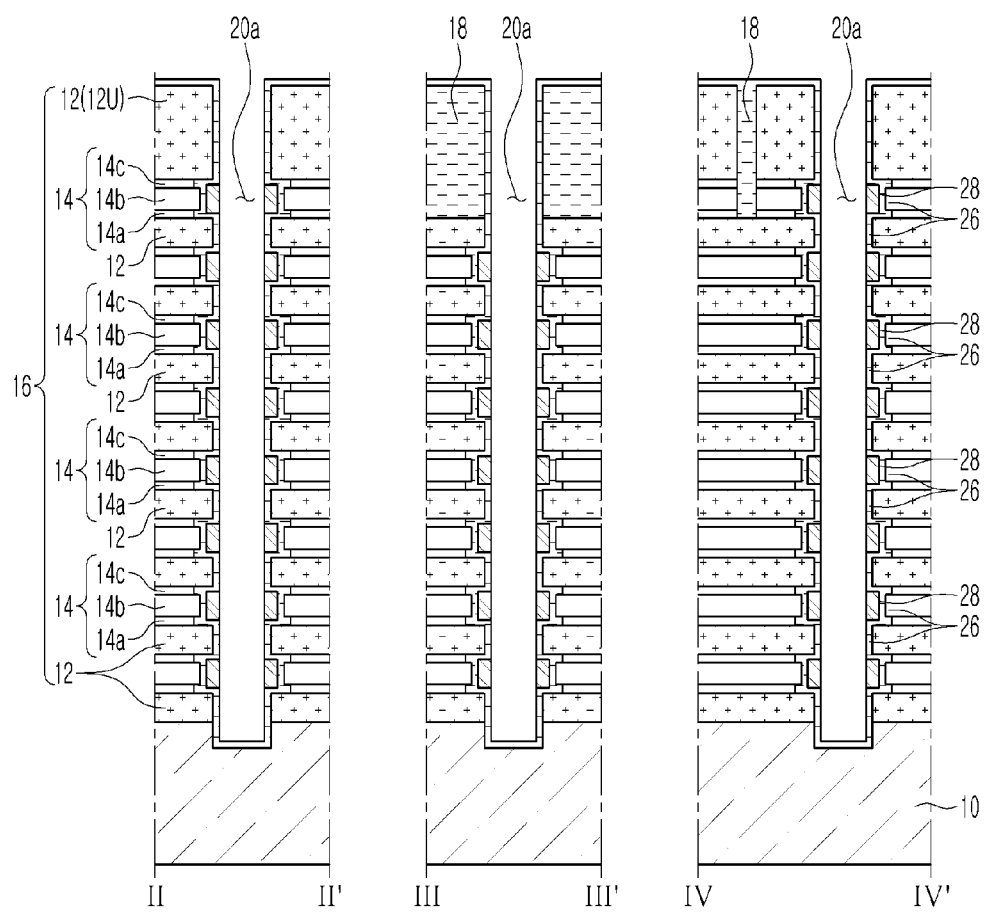

Referring to FIGS. 3, 11A, and 11B, a first dielectric layer 26, which is conformal, may be formed on the lower structure 10 having the holes 20a. For example, the first dielectric layer 26 may be conformally formed along an inner wall of the holes 20a. On the first dielectric layer 26, data storage patterns 28 filling recesses formed by etching the gate layers 14 between the interlayer insulating layers 12 may be provided.

Figure 12A:
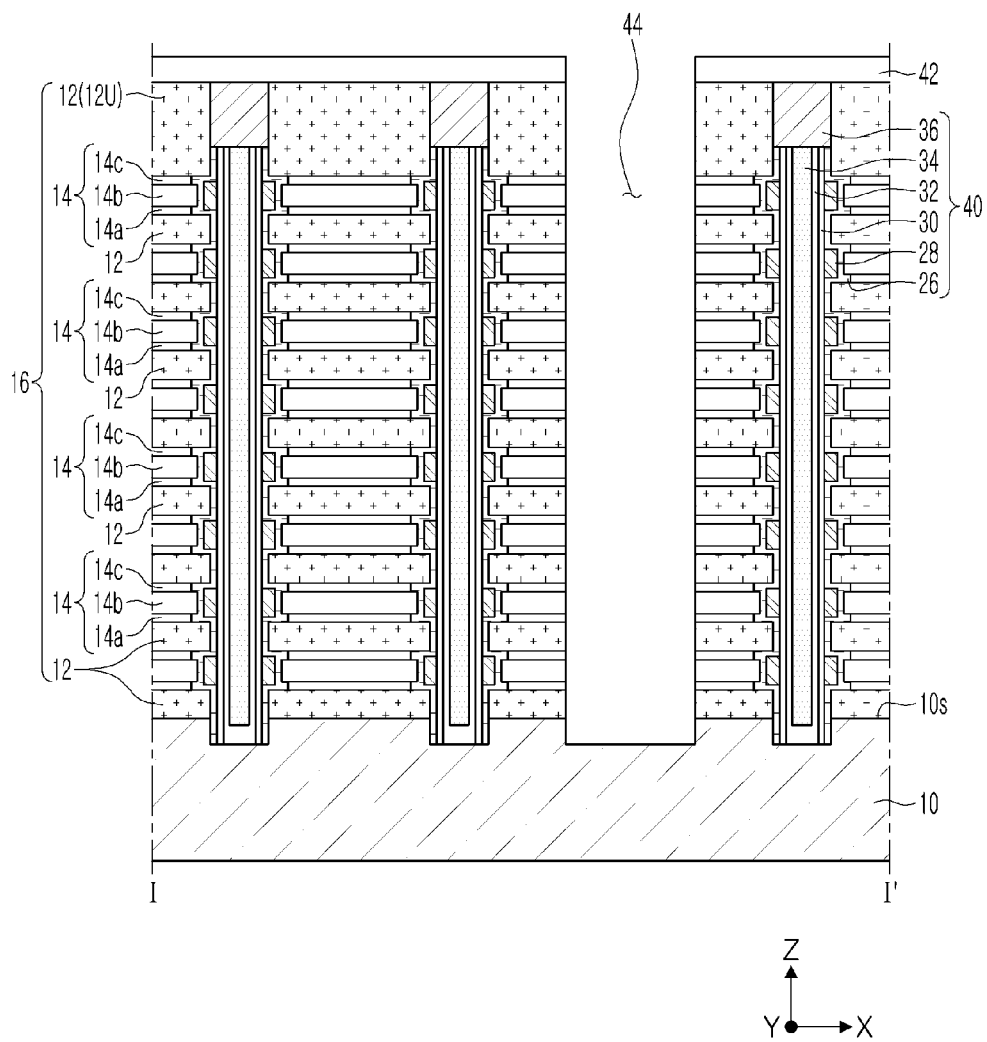
Figure 12B:
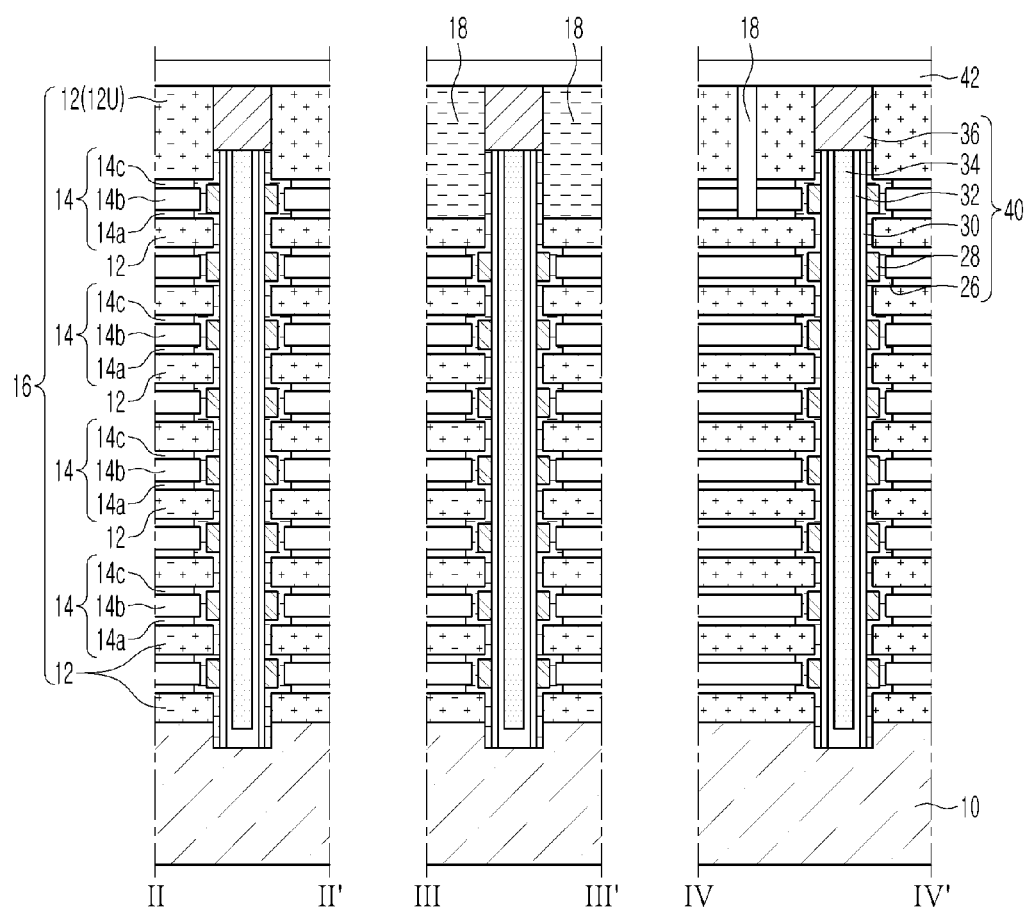

Referring to FIGS. 3, 12A, and 12B, the first dielectric layer 26 and the second dielectric layer 30, conformally covering the data storage patterns 28, are formed, the first dielectric layer 26 and the second dielectric layer 30 are anisotropically etched to expose the lower structure 10, a channel semiconductor layer 32, covering the second dielectric layer 30, is formed, a core pattern 34, partially filling respective holes (20a of FIGS. 11A and 11B), is formed on the channel semiconductor layer 32, and a pad pattern 36, filling a remainder of respective holes (20a of FIGS. 11A and 11B), may be formed. Thus, in each of the holes (20a of FIGS. 11A and 11B), the memory vertical structure 40, including the first dielectric layer 26, the data storage patterns 28, the second dielectric layer 30, the channel semiconductor layer 32, the core pattern 34, and the pad pattern 36, may be provided.

Next, a first upper insulating layer 42, covering the mold structure 16 and the memory vertical structures 40, may be provided. Then, a separation trench 44, passing through the mold structure 16 and the first upper insulating layer 42, may be provided. The separation trench 44 may have a line shape. The separation trench 44 may expose the lower structure 10, and may expose the gate layers 14 of the mold structure 16.

Figure 13A:
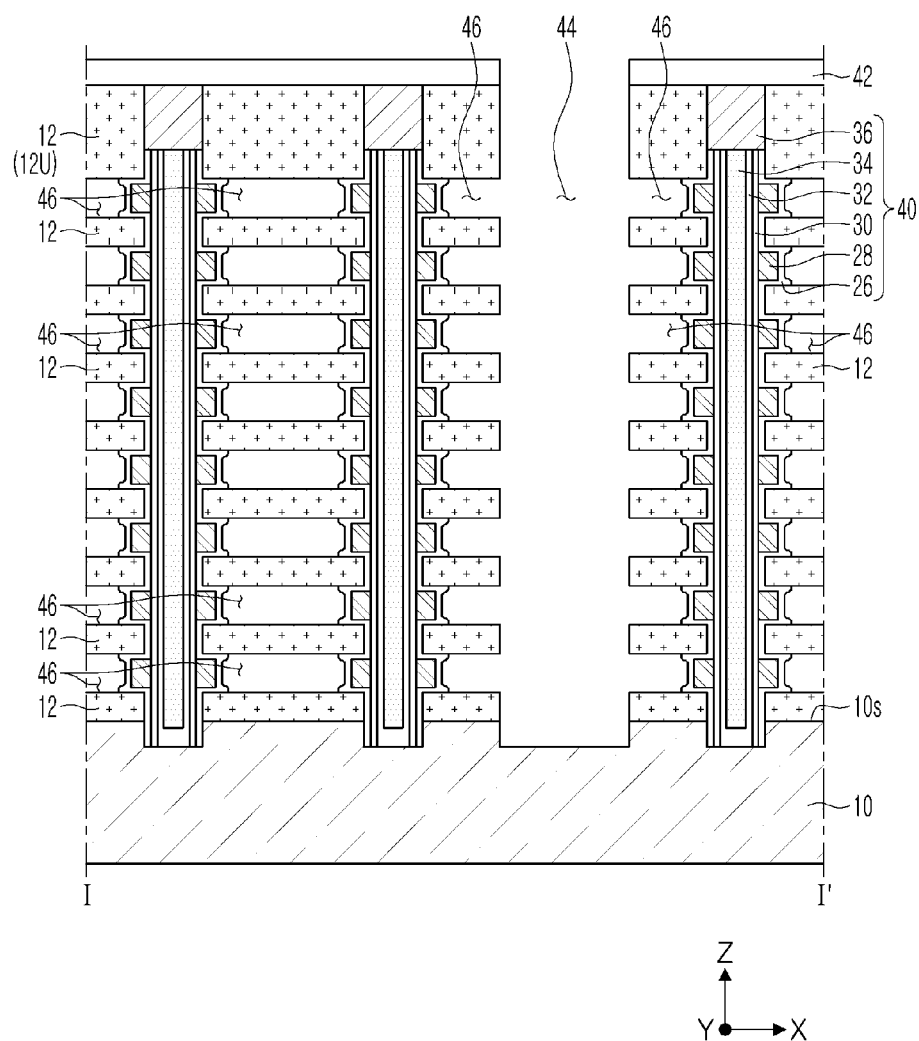
Figure 13B:
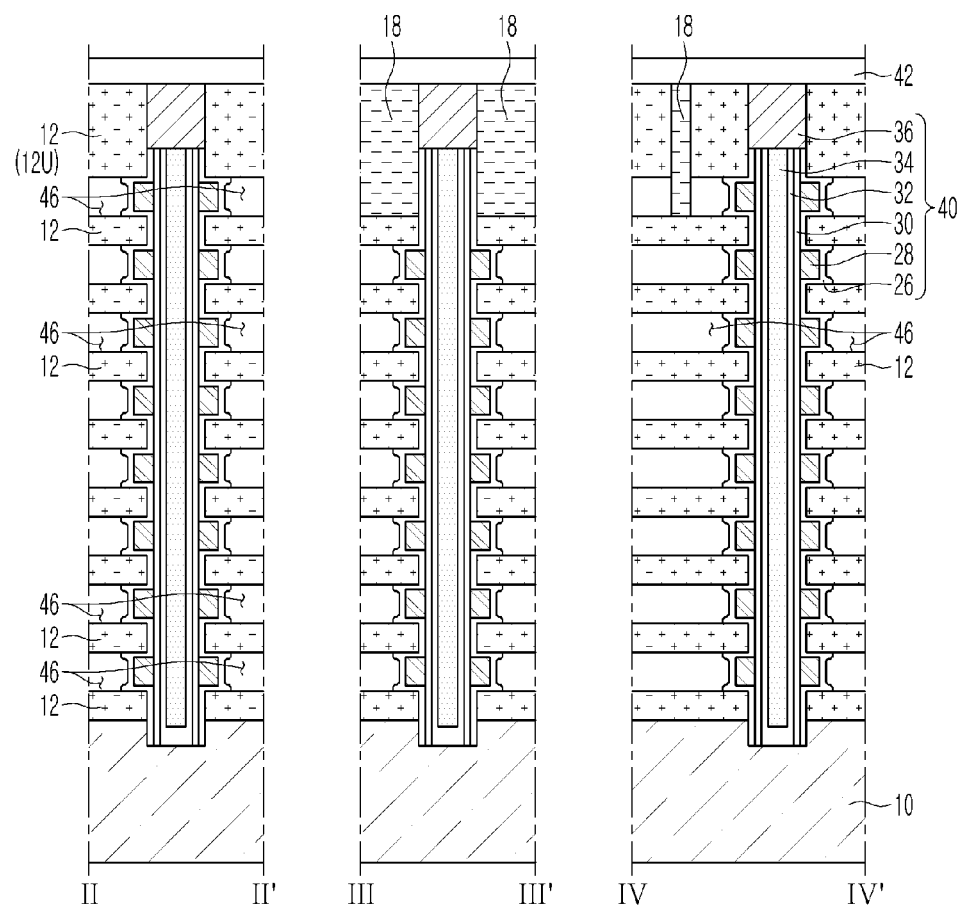

Referring to FIGS. 3, 13A, and 13B, a second etching process, in which a speed for etching the gate layers 14 is fast as compared with the first etching process, is performed to remove the gate layers 14, thereby forming empty spaces 46 between the interlayer insulating layers 12. For example, the first etching process for forming the recess regions (20r of FIG. 9A) by partially etching the gate layers 14 may be an etching process using etchant containing sulfuric acid, while the second etching process for removing the gate layers 14 may be an etching process using etchant containing phosphoric acid. The etchant of the etching process may be varied depending on a type of a material of the first to third layers 14a, 14b, and 14c of the gate layers 14. The empty spaces 46 may expose the first dielectric layer 26 of the memory vertical structure 40.

Again, referring to FIGS. 3, 4A, and 4B, gate patterns 52 may be formed in the empty spaces (46 of FIGS. 13A and 13B). Forming the gate patterns 52 may include forming a first material layer 48 conformally covering an inner wall of the empty spaces (46 of FIGS. 13A and 13B), and forming a second material layer 50 filling the empty spaces (46 of FIGS. 13A and 13B) on the first material layer 48.

A separation structure 60 may be formed in the separation trench 44. Forming the separation structure 60 may include forming spacers 56 on a side wall of the separation trench 44, and forming a separation pattern 58 filling the separation trench 44 between the spacers 56.

A second upper insulating layer 62 may be formed on the first upper insulating layer 42 and the separation structure 60. The contact plugs 64, passing through the first upper insulating layer 42 and the second upper insulating layer 62, may be provided. The contact plugs 64 may be electrically connected to the pad patterns 36 of the memory vertical structures 40. Conductive lines 66 may be formed on the second upper insulating layer 62. The conductive lines 66 may be electrically connected to the contact plugs 64.

In example embodiments, the data storage patterns 28 is defined in the recess regions (20r of FIG. 9B) and may be formed to be isolated. Each of the data storage patterns 28 described above may be surrounded by the first dielectric layer 26 and the second dielectric layer 30 and may be isolated. Thus, retention characteristics of data stored in the data storage patterns 28 to be isolated may be improved.

As set forth above, according to example embodiments of the present disclosure, a semiconductor device, capable of improving a degree of integration, and a method of forming the same may be provided. A method of forming a semiconductor device may include forming a gate layer including portions having different etch selectivity between interlayer insulating layers, forming a recess region by partially etching the gate layer, and forming a data storage pattern defined in the recess region to be isolated. Thus, since the data storage pattern may be defined in the recess region to be isolated, retention characteristics of data stored in the data storage pattern may be improved.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While example embodiments have been shown and described above, it will be apparent to those skilled in the art that modifications and variations could be made without departing from the scope of the present disclosure, as defined by the appended claims.

What is claimed is:

1. A method of manufacturing a semiconductor device comprising:
   forming a mold structure on a lower structure, the mold structure including interlayer insulating layers and gate layers alternately and repeatedly stacked, each of the gate layers being formed of a first layer, a second layer, and a third layer, sequentially stacked, the first layer and the third layer including a first material, the second layer including a second material having an etch selectivity different from an etch selectivity of the first material;
   exposing first side surfaces of the interlayer insulating layers and first side surfaces of the gate layers by forming a hole passing through the mold structure;
   forming the hole as an extended hole, the forming the hole as the extended hole including forming recessed regions by partially etching the gate layers, exposed by the hole, by performing an etching process in which an etching speed of the second material is different from an etching speed of the first material; and
   forming a memory vertical structure in the extended hole.

2. The method of claim 1, wherein the etching process is an etching process in which an etching speed of the second material is slower than an etching speed of the first material.

3. The method of claim 1, wherein:
   the first material and the second material are formed of silicon nitride, and
   a content of silicon in the second material is higher than a content of silicon in the first material.

4. The method claim 1, wherein the second material is formed of a material different from the first material.

5. The method of claim 1, wherein a thickness of the first layer is equal to a thickness of the third layer.

6. The method of claim 5, wherein a thickness of the second layer is greater than the thickness of each of the first layer and the third layer.

7. The method of claim 5, wherein a thickness of the second layer is equal to the thickness of each of the first layer and the third layer.

8. The method of claim 1, wherein the forming a memory vertical structure includes:
   forming a first dielectric layer on a side wall of the extended hole, forming data storage patterns in the recessed regions formed by partially etching the gate layers, and sequentially forming a second dielectric layer and a channel semiconductor layer, covering the first dielectric layer and the data storage patterns.

9. The method of claim 1, further comprising:

exposing second side surfaces of the interlayer insulating layers and second side surfaces of the gate layers by forming a separation trench passing through the mold structure;

forming empty spaces exposing a side surface of the memory vertical structure by removing the gate layers exposed by the separation trench;

forming gate patterns in the empty spaces; and forming a separation structure in the separation trench.

10. The method of claim 9, wherein the forming the gate patterns includes sequentially forming a first-material layer covering inner walls of the empty spaces and a second material layer filling the empty spaces.

11. A method of manufacturing a semiconductor device comprising:

forming a mold structure including interlayer insulating layers and gate layers alternately and repeatedly stacked on a lower structure, each of the gate layers being formed of a first layer, a second layer, and a third layer, sequentially stacked, the first layer and the third layer being formed of a first material, the second layer being formed of a second material having an etch selectivity different from an etch selectivity of the first material;

forming a hole passing through the mold structure;

forming recessed regions by partially etching the gate layers exposed by the hole using a first etching process, the hole being formed as an extended hole including the recessed regions;

forming a memory vertical structure in the extended hole;

forming a separation trench passing through the mold structure;

forming empty spaces exposing a side surface of the memory vertical structure by removing the gate layers exposed by the separation trench using a second etching process in which an etching speed for etching the gate layer is relatively fast, as compared with the first etching process; and forming gate patterns in the empty spaces.

12. The method of claim 11, wherein the first etching process is an etching process in which an etching rate of the second material is lower than an etching rate of the first material.

13. The method of claim 11, wherein the forming a memory vertical structure includes:

forming a first dielectric on a side wall of the extended hole, forming data storage patterns filling the recessed regions on the first dielectric, and sequentially forming a second dielectric and a channel semiconductor layer, covering the first dielectric and the data storage patterns.

14. The method of claim 13, wherein the forming the gate patterns includes:

forming a first-material layer covering an inner wall of each of the empty spaces, and forming a second material layer filling each of the empty spaces.

15. The method of claim 14, wherein the first-material layer is formed to have a thickness thinner than a thickness of the first dielectric.

16. A method of manufacturing a semiconductor device comprising:

forming a mold structure, the mold structure including interlayer insulating layers and a gate layer between the interlayer insulating layers, the gate layer including portions having an etch selectivity different from each other;

forming a hole exposing the interlayer insulating layers and the gate layer while passing through the mold structure;

forming a recessed region by partially etching the gate layer exposed by the hole, the hole being formed as an extended hole; and forming a memory vertical structure in the extended hole.

17. The method of claim 16, wherein:

the gate layer includes a first layer, a second layer, and a third layer, sequentially stacked, and the etching a gate layer exposed by the hole includes performing an etching process in which an etching rate of the second layer is lower than etching rates of the first layer and the third layer.

18. The method of claim 17, further comprising:

forming a separation trench passing through the mold structure;

forming an empty space exposing a side surface of the memory vertical structure by etching the gate layer exposed by the separation trench;

forming a gate pattern in the empty space; and forming a separation structure in the separation trench, wherein the memory vertical structure includes a first dielectric layer and a second dielectric layer, spaced apart from each other, in a portion opposing the gate layer, and a data storage pattern between the first dielectric layer and the second dielectric layer.

19. The method of claim 18, wherein in portions of the memory vertical structure opposing the interlayer insulating layers, the first dielectric layer and the second dielectric layer are in contact with each other.

20. The method of claim 16, wherein a side surface of the gate layer, formed while partially etching the gate layer exposed by the hole, is formed to have a curved shape, as compared with a side surface of the gate layer exposed while forming the hole exposing the interlayer insulating layers and the gate layer while passing through the mold structure.

* * * * *